United States Patent
Matsuo

(10) Patent No.: US 8,928,056 B2
(45) Date of Patent: Jan. 6, 2015

(54) NONVOLATILE SEMICONDUCTOR MEMORY DEVICE

(75) Inventor: Ichirou Matsuo, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 140 days.

(21) Appl. No.: 13/553,497

(22) Filed: Jul. 19, 2012

(65) Prior Publication Data

US 2012/0286343 A1   Nov. 15, 2012

Related U.S. Application Data

(63) Continuation of application No. PCT/JP2010/005107, filed on Aug. 18, 2010.

(30) Foreign Application Priority Data

Feb. 25, 2010   (JP) .................................. 2010-039685

(51) Int. Cl.
*H01L 27/108* (2006.01)
*H01L 29/94* (2006.01)
*H01L 27/115* (2006.01)
*H01L 29/66* (2006.01)
*H01L 29/788* (2006.01)
*H01L 29/861* (2006.01)
*H01L 27/06* (2006.01)

(52) U.S. Cl.
CPC .......... *H01L 29/94* (2013.01); *H01L 27/11521* (2013.01); *H01L 27/11558* (2013.01); *H01L 29/66825* (2013.01); *H01L 29/7881* (2013.01); *H01L 29/8611* (2013.01); *H01L 27/0629* (2013.01)
USPC ........................................................ 257/296

(58) Field of Classification Search
CPC ................... H01L 27/11521; H01L 27/11807; H01L 17/115; H01L 29/94; H01L 29/66825; H01L 29/8611; H01L 27/11558; H01L 27/0629
USPC ........................................................ 257/296
See application file for complete search history.

(56) References Cited

U.S. PATENT DOCUMENTS

| | | | |
|---|---|---|---|
| 5,465,231 A | 11/1995 | Ohsaki | |
| 5,844,300 A * | 12/1998 | Alavi et al. | 257/532 |
| 6,777,758 B2 * | 8/2004 | Yamashita et al. | 257/369 |
| 7,612,397 B2 * | 11/2009 | Ueda et al. | 257/296 |

(Continued)

FOREIGN PATENT DOCUMENTS

| | | |
|---|---|---|
| JP | 59-158546 | 9/1984 |
| JP | 01-251751 | 10/1989 |

(Continued)

*Primary Examiner* — William D Coleman
(74) *Attorney, Agent, or Firm* — McDermott Will & Emery LLP

(57) ABSTRACT

A memory device includes a MISFET on a semiconductor substrate of a first conductivity type, and a MIS capacitor on a first well of a second conductivity type. The MISFET includes a gate insulating film on the semiconductor substrate, a gate electrode, and a source/drain located at both sides of the gate electrode. The MIS capacitor includes a capacitor insulating film on the first well serving as a first electrode, a second electrode, and a first impurity layer of the first conductivity type. The gate electrode and the second electrode are electrically connected together, and form a floating gate. The gate insulating film and the capacitor insulating film are made of a same material, and have a same thickness. The gate electrode and the second electrode are made of a same conductive film. A second impurity layer is formed astride a border between the semiconductor substrate and the first well.

23 Claims, 11 Drawing Sheets

(56) References Cited

U.S. PATENT DOCUMENTS

| | | | |
|---|---|---|---|
| 8,345,488 B2 * | 1/2013 | Haggag et al. | 365/185.29 |
| 2001/0052616 A1 | 12/2001 | Ishige | |
| 2002/0117720 A1 * | 8/2002 | Lee et al. | 257/369 |
| 2007/0070707 A1 * | 3/2007 | Yamamoto et al. | 365/185.23 |
| 2007/0145459 A1 | 6/2007 | Park et al. | |
| 2009/0057767 A1 | 3/2009 | Takahashi et al. | |

FOREIGN PATENT DOCUMENTS

| | | |
|---|---|---|
| JP | 04-155862 | 5/1992 |
| JP | 6-334190 | 12/1994 |
| JP | 11-097560 | 4/1999 |
| JP | 2002-033397 | 1/2002 |
| JP | 2002-033397 A | 1/2002 |

\* cited by examiner

NONVOLATILE SEMICONDUCTOR MEMORY DEVICE

CROSS-REFERENCE TO RELATED APPLICATIONS

This is a continuation of PCT International Application PCT/JP2010/005107 filed on Aug. 18, 2010, which claims priority to Japanese Patent Application No. 2010-039685 filed on Feb. 25, 2010. The disclosures of these applications including the specifications, the drawings, and the claims are hereby incorporated by reference in their entirety.

BACKGROUND

In recent years, there is an increasing demand for system large scale integration (LSI) circuits to implement secure information represented by an encryption key. The memory capacity needed for such a purpose usually ranges from approximately several kilobits to approximately several hundreds of kilobits, and the memory does not require a very large capacity. However, information leakage due to analysis needs to be prevented. In order to prevent information leakage due to analysis, a method in which written information is not read from, e.g., layout and tracks of written information, such as a method in which a nonvolatile memory, such as a flash memory, is used, is useful.

When a nonvolatile memory, such as a flash memory, is incorporated into a system LSI circuit, a special process step needs to be added to a standard complementary metal oxide semiconductor (CMOS) process, resulting in complication of the process and an increase in cost. Here, in particular, when the necessary memory capacity is small, a need exists for inexpensive nonvolatile memories which can be mounted on the system LSI circuit without adding a special process step to the standard CMOS process.

As a technique related to this need, a nonvolatile semiconductor memory device has been proposed which includes an n-channel field effect transistor (hereinafter abbreviated as NMOSFET (metal oxide semiconductor field effect transistor)) and a PMOS capacitor.

The structure and operation of such a nonvolatile semiconductor memory device will be described hereinafter with reference to the drawings (see, for example, Japanese Patent Publication No. H06-334190 (hereinafter referred to as Document 1)).

FIG. 9 is a cross-sectional view of a nonvolatile semiconductor memory device 100 described in Document 1.

The nonvolatile semiconductor memory device 100 is formed on a p-type silicon substrate 101, and includes an NMOSFET 120 serving as a read transistor, and a PMOS capacitor 121 formed on an n-type well 105 formed in the p-type silicon substrate 101. The NMOSFET 120 includes a polysilicon gate electrode 103 formed on the p-type silicon substrate 101 with a gate insulating film 104 interposed therebetween, and source/drain impurity layers 102a and 102b formed in portions of the p-type silicon substrate 101 located at both sides of the polysilicon gate electrode 103. The PMOS capacitor 121 is formed on the n-type well 105, and includes p-type impurity layers 106a and 106b serving as electrodes of the capacitor, a polysilicon gate electrode 108 formed on the n-type well 105 with a gate insulating film 109 interposed therebetween, and an n-well contact impurity layer 107.

Here, the polysilicon gate electrode 103 and the polysilicon gate electrode 108 form portions of a continuous polysilicon layer, and a floating gate 110 is formed by connecting the polysilicon gate electrode 103 and the polysilicon gate electrode 108 together. The source/drain impurity layers 102a and 102b are connected to terminals 112 and 111, respectively. The p-type impurity layers 106a and 106b and the n-well contact impurity layer 107 are connected through a metal interconnect to a terminal 113, and have the same potential.

Next, operations of the nonvolatile semiconductor memory device 100 will be described with reference to FIGS. 10A-10C.

First, a write operation will be described with reference to FIG. 10A. In the write operation, the p-type silicon substrate 101 and the terminals 111 and 112 are all at ground potential, and a high positive voltage is applied to the terminal 113. This allows the floating gate 110 to have a positive potential relative to the ground potential by capacitive coupling, and a tunneling current flows through the gate insulating film 104 under the polysilicon gate electrode 103, resulting in injection of electrons into the polysilicon gate electrode 103, i.e., the floating gate 110. In this manner, the write operation is performed.

Next, a read operation will be described with reference to FIG. 10B. In the read operation, the p-type silicon substrate 101 and the terminal 111 are at ground potential, and, for example, a read voltage of approximately +3 V is applied to the terminals 112 and 113. Here, when electrons have not been injected into the floating gate 110, positive charge is generated in the polysilicon gate electrode 103, and a conduction channel is formed between the source/drain impurity layers 102a and 102b, thereby allowing a read current to flow through the terminal 112. In contrast, when electrons have been injected into the floating gate 110, the voltage of the polysilicon gate electrode 103 is not sufficiently positive, and thus, a read current does not flow through the terminal 112. In this manner, the read operation can be performed.

Next, an erase operation will be described with reference to FIG. 10C. In the erase operation, the terminal 113 is at ground potential, and a high positive voltage is applied to the terminals 111 and 112. Thus, a voltage is applied between the floating gate 110 in which electrons are stored and the source/drain impurity layers 102a and 102b, thereby allowing a tunneling current to flow through portions of the gate insulating film 104 overlapping the source/drain impurity layers 102a and 102b. As a result, electrons are removed from the floating gate 110, thereby performing the erase operation.

As above, the nonvolatile semiconductor memory device 100 operates as a floating gate memory using the n-type well 105 as a control gate.

SUMMARY

However, in the nonvolative semiconductor memory device 100, the n-type well 105 serving as the control gate may be exposed to a significantly higher voltage than a high voltage applied to the n-type well 105 in a typical write operation due to, e.g., charging caused during dry etching for contact holes in a fabrication process. In such a case, the voltage of the floating gate 110 increases due to capacitive coupling, thereby causing degradation in insulating properties of the gate insulating film 104 or a dielectric breakdown in the gate insulating film 104.

Degradation in insulating properties of the gate insulating film 104 degrades charge retention characteristics of the floating gate memory, leading to a reduction in quality. Furthermore, a dielectric breakdown in the gate insulating film 104 causes a malfunction in the floating gate memory, leading to a reduction in manufacturing yield.

In view of the above, a technique which is made to solve the above-mentioned problems of nonvolatile semiconductor memory devices, and provides nonvolatile semiconductor memory devices with manufacturing yield stability and quality stability will be described hereinafter.

In view of the foregoing point, the inventor of the present disclosure found the following. Typically, the junction breakdown voltage between an n-type well and a p-type silicon substrate reaches several tens of volts. Thus, when, e.g., charging is caused during dry etching, the voltage of the n-type well can increase to such a voltage. Advantageous methods for avoiding such degradation in insulating properties of a gate insulating film or a dielectric breakdown in a gate insulating film as described above include preventing the voltage of the n-type well from increasing to the above-described junction breakdown voltage.

Based on such a finding, a nonvolatile semiconductor memory device according to a first aspect of the present disclosure includes: a memory cell including a MISFET which is formed on a semiconductor substrate of a first conductivity type, and forms a channel of a second conductivity type, and a MIS capacitor formed on a first well of the second conductivity type in the semiconductor substrate. The MISFET includes a gate electrode formed on the semiconductor substrate with a gate insulating film interposed between the gate electrode and the semiconductor substrate, and source/drain impurity layers formed in portions of the semiconductor substrate located at both sides of the gate electrode, the MIS capacitor includes a second electrode formed on the first well functioning as a first electrode with a capacitor insulating film interposed between the second electrode and the first well, and a first impurity layer of a first conductivity type formed in the first well, the gate electrode and the second electrode are electrically connected together, and form a floating gate, the gate insulating film and the capacitor insulating film are made of a same material, and have a same thickness, the gate electrode and the second electrode are made of a same conductive film, and a second impurity layer is formed astride a border between the semiconductor substrate and the first well.

By using the first well as a gate, charge is stored in the floating gate including the gate electrode of the MISFET and the second electrode of the MIS capacitor which are electrically connected together, thereby allowing the memory cell of the nonvolatile semiconductor memory device according to the first aspect to store information. Furthermore, the memory cell can be fabricated without adding a special process step to a standard CMIS process.

Here, the presence of the second impurity layer reduces the effective junction breakdown voltage between the first well and the semiconductor substrate, and a high voltage applied to the gate electrode by charging can escape through the second impurity layer to the semiconductor substrate. This can prevent excessive voltage stress from being applied to the gate insulating film, and allows protection of the gate insulating film. Here, the effective junction breakdown voltage reduced by the second impurity layer is set higher than the voltage applied to the gate electrode in an operation of the memory cell, thereby preventing the operation of the memory cell from being affected. A MOSFET and a MOS capacitor may be used as the MISFET and the MIS capacitor, respectively.

The second impurity layer may have the first conductivity type, and a reverse breakdown voltage of a junction between the second impurity layer and the first well may be lower than a reverse breakdown voltage of a junction between the semiconductor substrate and the first well and higher than a voltage applied to the first well in an operation of the memory cell.

The second impurity layer may be configured specifically as above. With this structure, the effective junction breakdown voltage between the first well and the semiconductor substrate is reduced to a junction breakdown voltage of the interface between the second impurity layer and the first well, and a high voltage applied to the gate electrode can escape through the second impurity layer to the semiconductor substrate. The junction breakdown voltage between the second impurity layer and the first well is set higher than the voltage in the operation of the memory cell, thereby preventing the operation of the memory cell from being affected.

The second impurity layer may have an impurity concentration and a depth which are identical with an impurity concentration and depth of the first impurity layer, respectively.

Therefore, the second impurity layer can be formed at the same time as the first impurity layer, thereby reducing an increase in the number of manufacturing process steps.

The second impurity layer may have the second conductivity type, and a reverse breakdown voltage of a junction between the second impurity layer and the semiconductor substrate may be lower than a reverse breakdown voltage of a junction between the semiconductor substrate and the first well and higher than a voltage applied to the first well in an operation of the memory cell.

The second impurity layer may be configured specifically as above. With this structure, the effective junction breakdown voltage between the first well and the semiconductor substrate is reduced to a junction breakdown voltage between the second impurity layer and the semiconductor substrate, and a high voltage applied to the gate electrode can escape through the second impurity layer to the semiconductor substrate. The junction breakdown voltage between the second impurity layer and the semiconductor substrate is set higher than the voltage in the operation of the memory cell, thereby preventing the operation of the memory cell from being affected.

The second impurity layer may have an impurity concentration and a depth which are identical with an impurity concentration and depth of the first impurity layer, respectively.

Therefore, the second impurity layer can be formed at the same time as the source/drain impurity layers, thereby reducing an increase in the number of manufacturing process steps.

The MISFET may be formed on a second well of the first conductivity type formed in the semiconductor substrate instead of on the semiconductor substrate.

As such, the MISFET and the MIS capacitor may be both formed on the wells, and the second impurity layer may be formed astride the border between the wells. In this case, a high voltage applied to the first well can escape through the second impurity layer to the second well and then to the semiconductor substrate.

The semiconductor substrate may be p-type, the MISFET may be an n-type MISFET, and the MIS capacitor may be a p-type MIS capacitor.

An area occupied by the gate insulating film may be smaller than an area occupied by the capacitor insulating film.

With this structure, a voltage applied to the first well in an operation of the memory cell is divided by the capacity ratio between the gate insulating film and the capacitor insulating film such that a higher voltage is applied to the gate insulating film. This can further ensure a predetermined operation.

The MIS capacitor may be a write capacitor.

Next, a nonvolatile semiconductor memory device according to a second aspect of the present disclosure includes: a memory cell including a MISFET which is formed on a semiconductor substrate of a first conductivity type, and forms a channel of a second conductivity type, a first MIS capacitor formed on a first well of the second conductivity type in the semiconductor substrate, and a second MIS capacitor formed on a second well of the second conductivity type in the semiconductor substrate. The MISFET includes a gate electrode formed on the semiconductor substrate with a gate insulating film interposed between the gate electrode and the semiconductor substrate, and source/drain impurity layers formed in portions of the semiconductor substrate located at both sides of the gate electrode, the first MIS capacitor includes a second electrode formed on the first well functioning as a first electrode with a first capacitor insulating film interposed between the second electrode and the first well, and a first impurity layer of the first conductivity type formed in the first well, the second MIS capacitor includes a fourth electrode formed on the second well functioning as a third electrode with a second capacitor insulating film interposed between the fourth electrode and the second well, the gate electrode, the second electrode, and the fourth electrode are electrically connected together, and form a floating gate, the gate insulating film, the first capacitor insulating film, and the second capacitor insulating film are made of a same material, and have a same thickness, the gate electrode, the second electrode, and the fourth electrode are made of a same conductive film, a second impurity layer is formed astride a border between the semiconductor substrate and the first well, and a third impurity layer is formed astride a border between the semiconductor substrate and the second well.

The memory cell of the nonvolatile semiconductor memory device according to the second aspect stores information by storing charge in the floating gate including the gate electrode, the second electrode, and the fourth electrode which are electrically connected together. Furthermore, the memory cell can be fabricated without adding a special process step to a standard CMIS process.

Furthermore, the presence of the second impurity layer can reduce the effective junction breakdown voltage between the first well and the semiconductor substrate, and the presence of the third impurity layer can reduce the effective junction breakdown voltage between the second well and the semiconductor substrate. This allows a high voltage applied to the gate electrode by charging to escape to the semiconductor substrate, and allows protection of the gate insulating film. Moreover, the effective junction breakdown voltage between the first well and the semiconductor substrate and the effective junction breakdown voltage between the second well and the semiconductor substrate are set higher than the voltage applied to the gate electrode in an operation of the memory cell, thereby preventing the operation of the memory cell from being affected.

The second MIS capacitor may further include a fourth impurity layer of the first conductivity type formed in the second well.

The second impurity layer may have the first conductivity type, and a reverse breakdown voltage of a junction between the second impurity layer and the first well may be lower than a reverse breakdown voltage of a junction between the semiconductor substrate and the first well and higher than a voltage applied to the first well in an operation of the memory cell.

The second impurity layer may be configured specifically as above. With this structure, a high voltage applied to the gate electrode can escape through the second impurity layer to the semiconductor substrate.

The second impurity layer may have an impurity concentration and a depth which are identical with an impurity concentration and depth of the first impurity layer, respectively. This can reduce an increase in the number of manufacturing process steps.

The second impurity layer may have the second conductivity type, and a reverse breakdown voltage of a junction between the second impurity layer and the semiconductor substrate may be lower than a reverse breakdown voltage of a junction between the semiconductor substrate and the first well and higher than a voltage applied to the first well in an operation of the memory cell.

The second impurity layer may be configured specifically as above. With this structure, a high voltage applied to the gate electrode can escape through the second impurity layer to the semiconductor substrate.

The second impurity layer may have an impurity concentration and a depth which are identical with an impurity concentration and depth of each of the source/drain impurity layers, respectively. This can reduce an increase in the number of manufacturing process steps.

The third impurity layer may have the first conductivity type, and a reverse breakdown voltage of a junction between the third impurity layer and the second well may be lower than a reverse breakdown voltage of a junction between the semiconductor substrate and the second well and higher than a voltage applied to the second well in an operation of the memory cell.

The third impurity layer may be configured specifically as above. With this structure, the effective junction breakdown voltage between the second well and the semiconductor substrate is reduced to a junction breakdown voltage of the interface between the third impurity layer and the second well, and a high voltage applied to the gate electrode can escape through the third impurity layer to the semiconductor substrate.

The third impurity layer may have an impurity concentration and a depth which are identical with an impurity concentration and depth of the second impurity layer, respectively. This can reduce an increase in the number of manufacturing process steps.

The third impurity layer may have the second conductivity type, and a reverse breakdown voltage of a junction between the third impurity layer and the semiconductor substrate may be lower than a reverse breakdown voltage of a junction between the semiconductor substrate and the second well and higher than a voltage applied to the second well in an operation of the memory cell.

The third impurity layer may be configured specifically as above. With this structure, a high voltage applied to the gate electrode can escape through the third impurity layer to the semiconductor substrate.

The third impurity layer may have an impurity concentration and a depth which are identical with an impurity concentration and depth of each of the source/drain impurity layers, respectively. This can reduce an increase in the number of manufacturing process steps.

The MISFET may be formed on a third well of the first conductivity type formed in the semiconductor substrate instead of on the semiconductor substrate.

As such, the MISFET and the second MIS capacitor may be both formed on wells, and the third impurity layer may be formed astride the border between the wells.

The semiconductor substrate may be p-type, the MISFET may be an n-type MISFET, and both of the first MIS capacitor and the second MIS capacitor may be p-type MIS capacitors.

An area occupied by the gate insulating film may be smaller than an area occupied by the first capacitor insulating film and larger than an area occupied by the second capacitor insulating film.

The high voltage applied to the first well in the operation of the memory cell is divided by the capacity ratio among the first capacitor insulating film, the gate insulating film, and the second capacitor insulating film. As a result, a higher voltage is applied to the gate insulating film than to the first capacitor insulating film, and a higher voltage is applied to the second capacitor insulating film than to the gate capacitor insulating film, thereby further ensuring a predetermined operation.

The first MIS capacitor may be a write capacitor, and the second MIS capacitor may be an erase capacitor.

The nonvolatile semiconductor memory device described above can reduce degradation or a breakdown in the gate insulating film due to the influence of, e.g., charging during a fabrication process, thereby providing nonvolatile semiconductor memory devices with yield stability and quality stability at low cost.

DETAILED DESCRIPTION

First Embodiment

Figure 1:
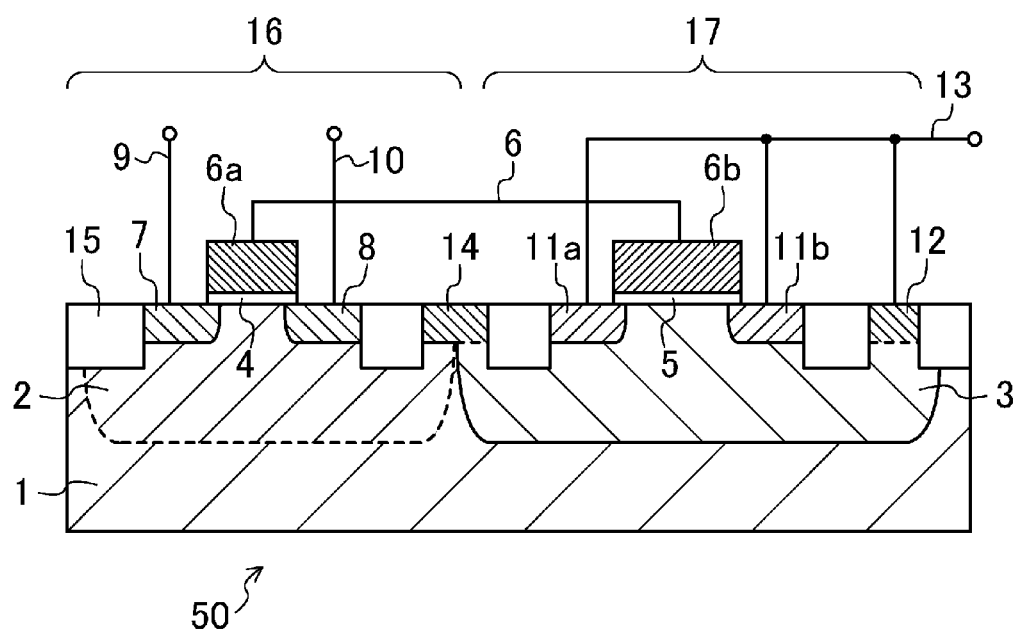
FIG. 1 is a diagram schematically illustrating a cross-sectional structure of an example nonvolatile semiconductor memory device according to a first embodiment.

A nonvolatile semiconductor memory device of a first embodiment and a method for fabricating the same will be described hereinafter with reference to the drawings. FIG. 1 is a diagram schematically illustrating a cross-sectional structure of an example nonvolatile semiconductor memory device 50 according to this embodiment.

As illustrated in FIG. 1, the nonvolatile semiconductor memory device 50 is formed using a p-type silicon substrate 1 including a p-type well 2 and an n-type well 3 which have approximately the same impurity concentration and approximately the same depth. The impurity concentration and depth of each of the p-type well 2 and the n-type well 3 are, for example, approximately $1\times10^{17}$ $cm^3$ and approximately 2 μm, respectively.

A read transistor 16 is formed on a region of the p-type well 2 defined by an isolation insulating film 15, and serves as an NMISFET including a gate insulating film 4 and a polysilicon gate electrode 6a which are formed on the p-type well 2, and an n-type source impurity layer 7 and an n-type drain impurity layer 8 which are formed at both sides of a combination of the gate insulating film 4 and the polysilicon gate electrode 6a.

Furthermore, a write capacitor 17 is formed on a region of the n-type well 3 defined by the isolation insulating film 15, and serves as a PMIS capacitor including p-type impurity layers 11a and 11b, a capacitor insulating film 5, and a polysilicon capacitor electrode 6b formed on the capacitor insulating film 5. Moreover, a heavily doped n-type well contact impurity layer 12 is formed in the n-type well 3 so as to be surrounded by the isolation insulating film 15.

Specific examples of the MISFET and the MIS capacitor may include a MOSFET and a MOS capacitor.

Here, the gate insulating film 4 and the capacitor insulating film 5 have the same thickness, e.g., a thickness of 7 nm. The polysilicon gate electrode 6a and the polysilicon capacitor electrode 6b form portions of a continuous polysilicon layer, are, therefore, electrically connected together, and form a floating gate 6.

The area of the capacitor insulating film 5 is sufficiently larger than that of the gate insulating film 4, and is set to, e.g., approximately three times the area of the gate insulating film 4.

The heavily doped n-type source impurity layer 7 and the heavily doped n-type drain impurity layer 8 both formed in the p-type well 2 are connected to a source terminal 9 and a drain terminal 10, respectively. The heavily doped p-type impurity layers 11a and 11b formed in the n-type well 3, and the heavily doped n-type well contact impurity layer 12 are all connected to a control gate terminal 13.

Furthermore, a protective diode n-type impurity layer 14 is formed astride the border between the p-type well 2 and the n-type well 3, and has the same impurity concentration as each of the n-type source impurity layer 7 and the n-type drain impurity layer 8 and the same depth thereas (e.g., an impurity concentration of approximately $1\times10^{20}$ $cm^3$ and a depth of approximately 0.1 μm). The reverse breakdown voltage of a pn junction formed between the protective diode n-type impurity layer 14 and the p-type well 2 is set higher than the highest voltage applied to the control gate terminal 13 in an operation of a memory cell and sufficiently lower than the reverse breakdown voltage of a pn junction formed between the p-type well 2 and the n-type well 3, and is set, for example, approximately slightly higher than 10 V. In order to reduce degradation in insulating properties of an insulating film and a dielectric breakdown in an insulating film, the reverse breakdown voltage of the pn junction between the protective diode n-type impurity layer 14 and the p-type well 2 is preferably set to a voltage up to approximately 12 V.

An operation of the nonvolatile semiconductor memory device 50 having the above structure will be described with reference to FIG. 2.

Figure 2:
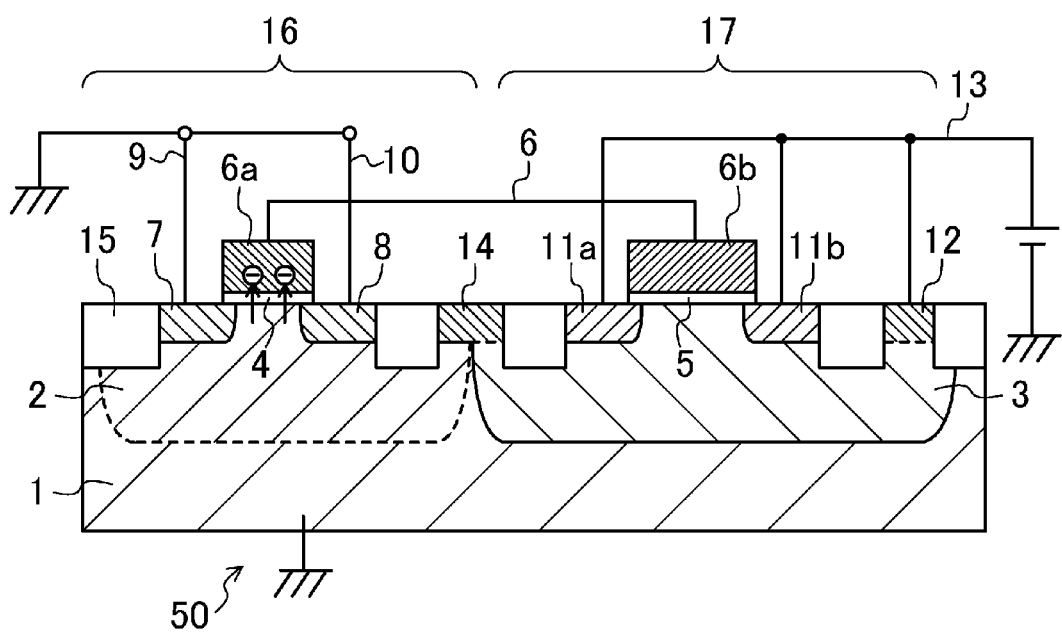
FIG. 2 is a schematic view illustrating a write operation of the example nonvolatile semiconductor memory device according to the first embodiment.

FIG. 2 is a schematic view illustrating a write operation into the nonvolatile semiconductor memory device 50. As illustrated in FIG. 2, the p-type silicon substrate 1, the source terminal 9, and the drain terminal 10 are all at ground potential, and a high voltage for the write operation, such as 9 V, is applied to the control gate terminal 13.

In this case, since the reverse breakdown voltage of the pn junction between the protective diode n-type impurity layer 14 and the p-type well 2 is higher than 10 V as described above, a breakdown due to the write voltage does not occur. Thus, the provision of the protective diode n-type impurity layer 14 does not affect the write operation.

The high voltage (in this example, 9 V) applied to the control gate terminal 13 is divided by the capacity ratio between the gate insulating film 4 and the capacitor insulating film 5. Since the material and thickness of the gate insulating film 4 are identical with the material and thickness of the capacitor insulating film 5, respectively, the capacity ratio between the gate insulating film 4 and the capacitor insulating film 5 is equal to the area ratio therebetween. The area of the capacitor insulating film 5 is set to approximately three times the area of the gate insulating film 4. Therefore, a high voltage of approximately 7 V is applied to the gate insulating film 4. As a result, a tunneling current flows through the gate insulating film 4, and electrons are injected into the polysilicon gate electrode 6a, i.e., the floating gate 6.

A read operation of the nonvolatile semiconductor memory device 50 is similar to that of the nonvolatile semiconductor memory device in the BACKGROUND section. Specifically, the p-type silicon substrate 1 and the source terminal 9 are at ground potential, and a read voltage of, e.g., approximately +3 V is applied to the drain terminal 10 and the control gate terminal 13. When a write operation is not performed (electrons are not injected into the floating gate 6), a positive charge is generated in the polysilicon gate electrode 6a, and a conduction channel is formed between the n-type source impurity layer 7 and the n-type drain impurity layer 8, thereby allowing a read current to flow through the drain terminal 10. In contrast, when a write operation is performed (electrons are injected into the floating gate 6), the voltage of the polysilicon gate electrode 6a is not sufficiently positive, and thus, no current flows through the drain terminal 10. In this manner, the presence or absence of charge depending on whether or not a write operation has been performed can be identified, thereby performing a read operation.

An erase operation of the nonvolatile semiconductor memory device 50 is also similar to that of the nonvolatile semiconductor memory device in the BACKGROUND section. Specifically, the control gate terminal 13 is at ground potential, and a high positive potential is applied to the source terminal 9 and the drain terminal 10. Thus, a voltage is applied between the floating gate 6 in which electrons are stored and the n-type source impurity layer 7 or the n-type drain impurity layer 8, thereby allowing a tunneling current to flow through a portion of the gate insulating film 4 overlapping the n-type source impurity layer 7 or the n-type drain impurity layer 8. As a result, electrons are removed from the floating gate 6, thereby performing an erase operation.

In both of the read operation and the erase operation, a high voltage is not applied between the n-type well 3 and the p-type silicon substrate 1 or the p-type well 2.

As above, a memory cell including the read transistor 16 and the write capacitor 17 operates.

Next, a method for fabricating the nonvolatile semiconductor memory device 50 will be described with reference to FIGS. 3A-3C and FIG. 4.

Figure 3A:
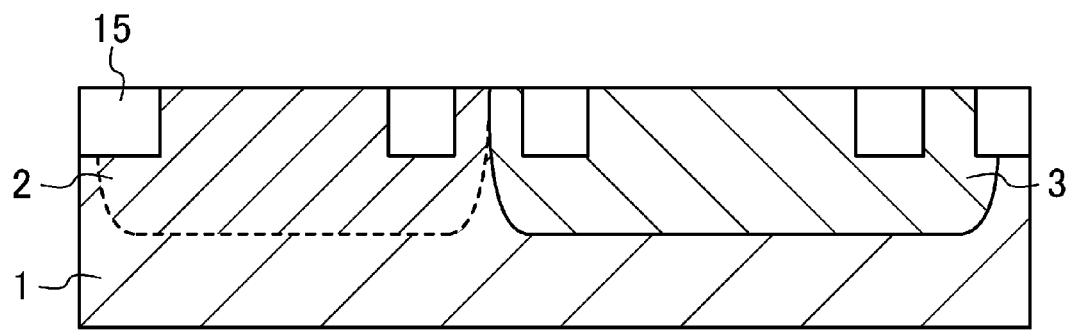
FIGS. 3A-3C are cross-sectional views illustrating process steps in a method for fabricating the example nonvolatile semiconductor memory device according to the first embodiment.

First, as illustrated in FIG. 3A, a p-type well 2, an n-type well 3, and an isolation insulating film 15 are sequentially formed in a p-type silicon substrate 1. The p-type well 2 and the n-type well 3 are similar to a well for forming a typical MISFET for a logic or analog circuit, and a special process step does not need to be added.

Figure 3B:
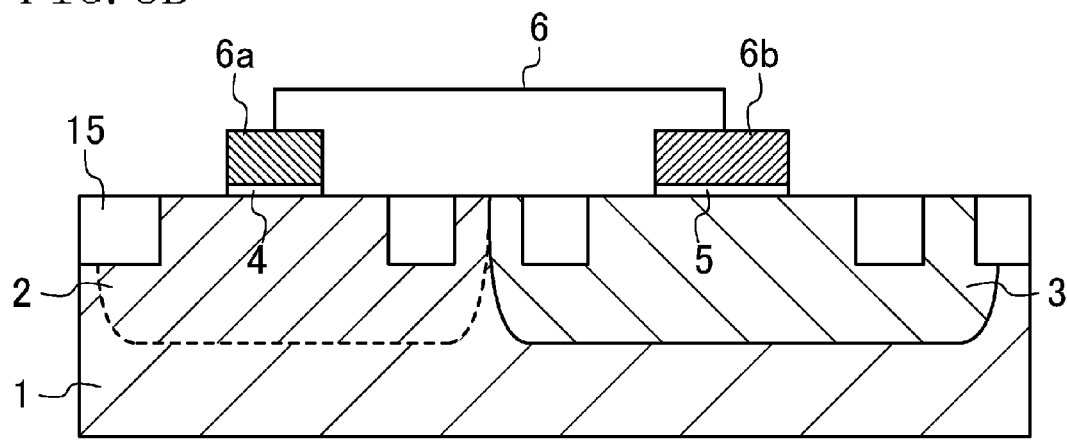

Next, as illustrated in FIG. 3B, a gate insulating film 4 and a capacitor insulating film 5 are formed to have the same thickness. Furthermore, a polysilicon gate electrode 6a and a polysilicon capacitor electrode 6b forming portions of a continuous polysilicon layer are formed on the gate insulating film 4 and the capacitor insulating film 5, respectively, so as to be electrically connected together, and form a floating gate 6. Here, the gate insulating film 4 and the capacitor insulating film 5 can be formed at the same time. Moreover, the polysilicon gate electrode 6a and the polysilicon capacitor electrode 6b can be formed at the same time as a polysilicon gate of a typical MISFET for a logic or analog circuit. Thus, both of the polysilicon gate electrode 6a and the polysilicon capacitor electrode 6b can be formed without adding a special process step.

Figure 3C:
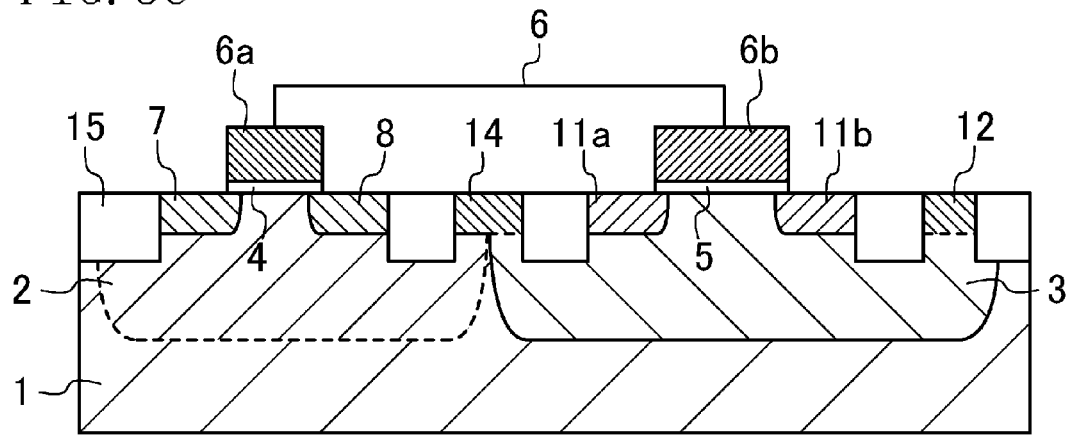

Next, as illustrated in FIG. 3C, a heavily doped n-type source impurity layer 7 and a heavily doped n-type drain impurity layer 8 are formed in the p-type well 2 to be adjacent to the polysilicon gate electrode 6a.

Furthermore, a protective diode n-type impurity layer 14 is formed astride the border between the p-type well 2 and the n-type well 3.

P-type impurity layers 11a and 11b are formed in the n-type well 3 to be adjacent to the polysilicon capacitor electrode 6b, and an n-type well contact impurity layer 12 is formed so as to be surrounded by the isolation insulating film 15.

All of the impurity layers are formed at the same time as source/drain impurity layers, etc., of a typical MISFET for a logic or analog circuit, and can be formed without adding a special process step. An increase in the number of process steps can be avoided, in particular, by forming the protective diode n-type diffusion layer 14 at the same time as the n-type source impurity layer 7 and the n-type drain impurity layer 8.

Figure 4:
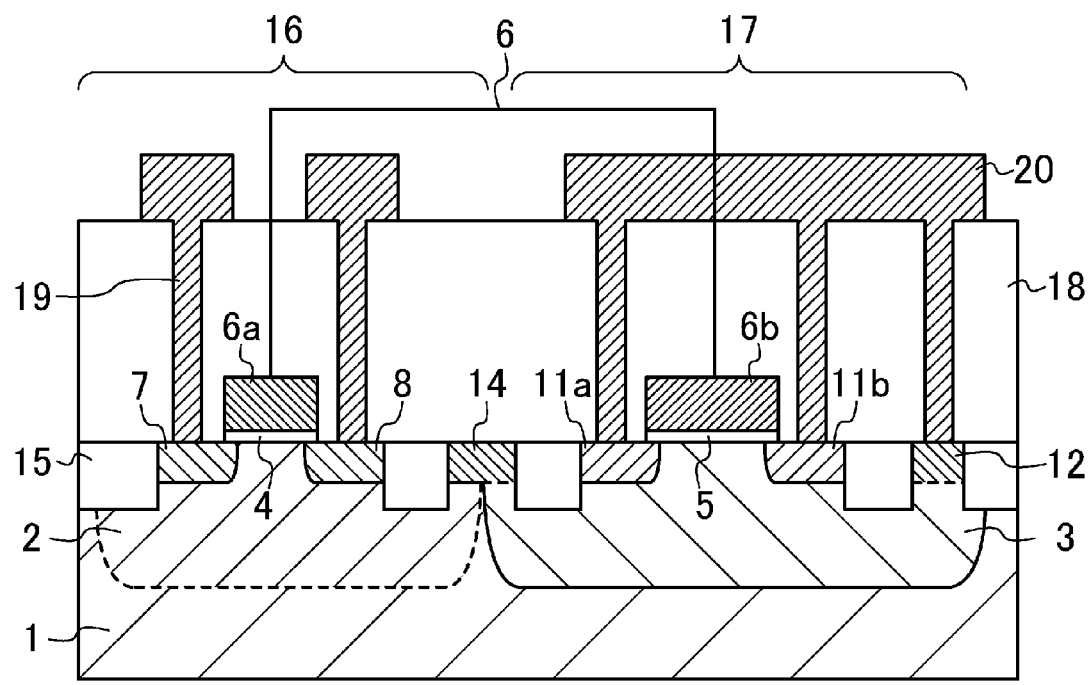
FIG. 4 is a cross-sectional view illustrating a process step subsequent to the process step illustrated in FIG. 3C in the method for fabricating the example nonvolatile semiconductor memory device according to the first embodiment.

Next, as illustrated in FIG. 4, an interlayer insulating film 18 is formed to cover a read transistor 16 and a write capacitor 17; contact holes 19 are formed to reach the impurity layers (the n-type source impurity layer 7, the n-type drain impurity layer 8, the p-type impurity layers 11a and 11b, and the n-type well contact impurity layer 12); and then a metal interconnect layer 20 is formed. The source terminal 9, the drain terminal 10, and the control gate terminal 13 all illustrated in FIG. 1 correspond to portions of the metal interconnect layer 20.

As such, a nonvolatile semiconductor memory device 50 is fabricated. In such a fabrication process, for example, dry etching using plasma is typically performed to form contact holes 19. Thus, during dry etching, the n-type well 3 may be positively or negatively charged with respect to the p-type silicon substrate 1 or the p-type well 2.

When the n-type well 3 has been negatively charged, a diode forward voltage less than or equal to about 1 V is applied to the p-type silicon substrate 1 and the p-type well 2, and thus, a high voltage is not applied to the n-type well 3. Thus, there is no problem.

In contrast, when the n-type well 3 has been positively charged, the voltage of the n-type well 3 is fixed at the reverse breakdown voltage of the pn junction formed between the protective diode n-type impurity layer 14 and the p-type well 2. The reverse breakdown voltage can be set at a desired value, such as 11 V, by adjusting, e.g., the impurity concentration of the protective diode n-type impurity layer 14.

Specifically, when the n-type well 3 has been positively charged, and has had a higher voltage than the reverse breakdown voltage of the pn junction between the protective diode n-type impurity layer 14 and the p-type well 2, such as 11 V, the breakdown voltage of the pn junction is exceeded, and the high voltage escapes through the protective diode n-type impurity layer 14 to the p-type well 2 (and then to the p-type silicon substrate 1).

As a result, excessive voltage stress is not applied to the gate insulating film 4 and the capacitor insulating film 5. This can reduce degradation in insulating properties of the gate insulating film 4 and the capacitor insulating film 5 and a dielectric breakdown in the gate insulating film 4 and the capacitor insulating film 5.

If no protective diode n-type impurity layer 14 exists, excessive voltage stress is applied to the gate insulating film 4 and the capacitor insulating film 5. The reason for this is that the reverse breakdown voltage between the n-type well 3 and the p-type well 2 is high, for example, higher than or equal to 30 V. The application of excessive voltage stress has caused degradation in insulating properties of the gate insulating film 4 and the capacitor insulating film 5 and a dielectric breakdown in the gate insulating film 4 and the capacitor insulating film 5. The nonvolatile semiconductor memory device 50 of this embodiment can reduce degradation in insulating properties of the gate insulating film 4 and the capacitor insulating film 5 and a dielectric breakdown in the gate insulating film 4 and the capacitor insulating film 5.

In the above-described structure of the nonvolatile semiconductor memory device 50, the protective diode n-type impurity layer 14 is formed astride the border between the n-type well 3 and the p-type well 2 on which the read transistor 16 is formed. However, the protective diode n-type impurity layer 14 may be formed astride the border between the n-type well 3 and another p-type well formed in the p-type silicon substrate 1 except the p-type well 2. Also in this case, a high voltage can escape through the protective diode n-type impurity layer 14 to another p-type well and then to the p-type silicon substrate 1. Here, the phrase "pn junction between the protective diode n-type impurity layer 14 and the p-type well 2" in the above description is replaced with, e.g., the phrase "pn junction between the protective diode n-type diffusion layer 14 and another p-type well." An NMISFET forming a CMIS integrated circuit, for example, may be formed on another p-type well except the p-type well 2.

In the above description, the protective diode n-type impurity layer 14 has an impurity concentration and a depth which are respectively identical with the impurity concentration and depth of each of the n-type source impurity layer 7 and the n-type drain impurity layer 8. This structure is an advantageous structure for reducing an increase in the number of manufacturing process steps, but is not essential. The impurity concentration and depth of the protective diode n-type impurity layer 14 may be adjusted by adding a manufacturing process step such that the breakdown voltage between the protective diode n-type impurity layer 14 and the p-type well is optimum.

An example write method utilizing tunneling current was described. In this write method, in the nonvolatile semiconductor memory device 50 of this embodiment, a high voltage is applied to the gate insulating film 4, and electrons are injected into the floating gate 6. However, any other electron injection methods, such as hot electron injection, may be used.

Figure 11:
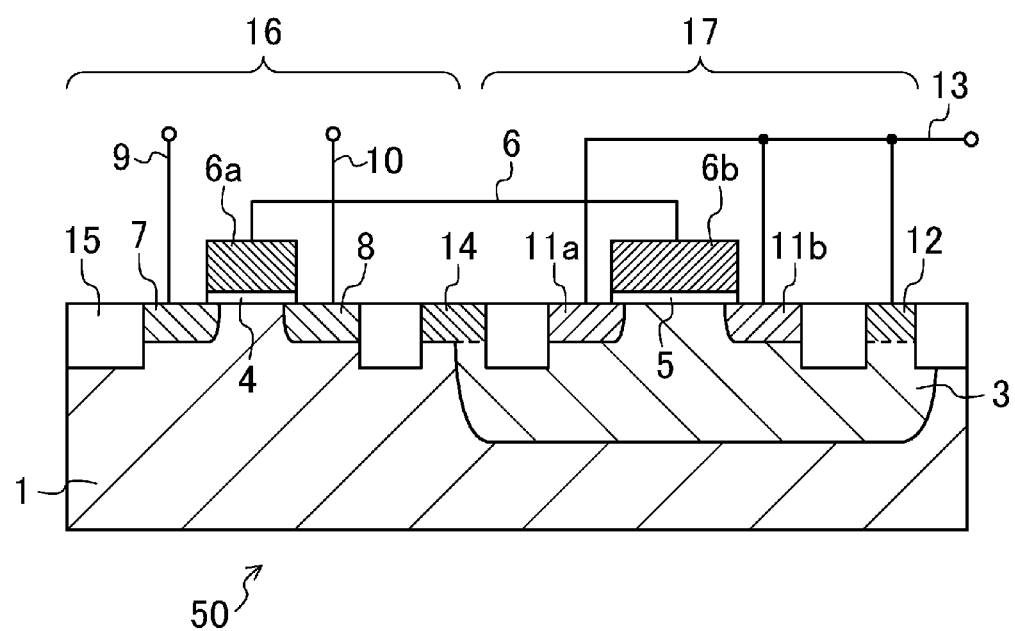
FIG. 11 is a cross-sectional diagram illustrating a variation of the nonvolatile semiconductor memory device illustrated in FIG. 1

In the nonvolatile semiconductor memory device 50 of this embodiment, the read transistor 16 is formed on the p-type well 2. However, as shown in FIG. 11, the read transistor 16 may be formed on the p-type silicon substrate 1 itself without forming the p-type well 2. In this case, the protective diode n-type impurity layer 14 is formed astride the border between the p-type silicon substrate 1 and the n-type well 3. A high voltage applied to the n-type well 3 can escape through the protective diode n-type impurity layer 14 to the p-type silicon substrate 1. Here, the phrase "pn junction between the protective diode n-type impurity layer 14 and the p-type well 2" in the above description is replaced with, e.g., the phrase "pn junction between the protective diode n-type diffusion layer 14 and the p-type silicon substrate 1."

Second Embodiment

Figure 5:
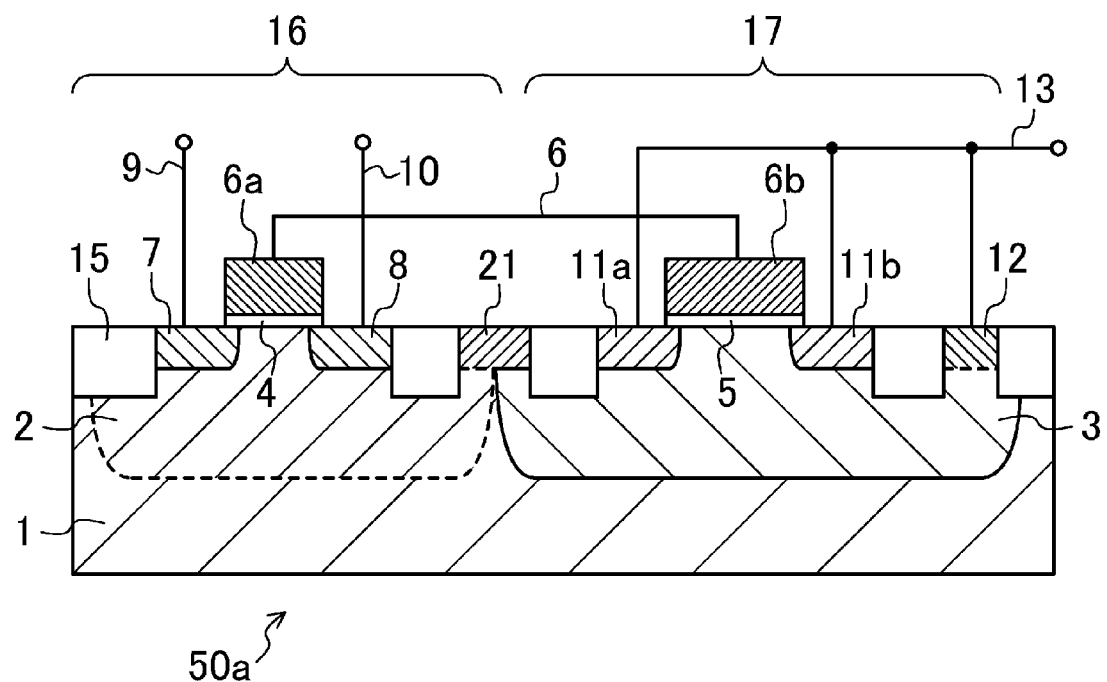
FIG. 5 is a diagram schematically illustrating a cross-sectional structure of an example nonvolatile semiconductor memory device according to a second embodiment.

A nonvolatile semiconductor memory device of a second embodiment and a method for fabricating the same will be described hereinafter with reference to the drawings. FIG. 5 is a diagram schematically illustrating a cross-sectional structure of an example nonvolatile semiconductor memory device 50a according to this embodiment.

The nonvolatile semiconductor memory device 50a in FIG. 5 includes elements similar to those of the nonvolatile semiconductor memory device 50 in FIG. 1, and thus, the same reference characters as those illustrated in FIG. 1 are used to represent such equivalent elements.

Specifically, a p-type well 2 and an n-type well 3 are formed in a p-type silicon substrate 1, and are defined by an isolation insulating film 15. A read transistor 16 includes a gate insulating film 4, a polysilicon gate electrode 6a, an n-type source impurity layer 7, and an n-type drain impurity layer 8, and is formed on the p-type well 2. A source terminal 9 and a drain terminal 10 are connected to the n-type source impurity layer 7 and the n-type drain impurity layer 8, respectively. A write capacitor 17 includes a capacitor insulating film 5, a polysilicon capacitor electrode 6b, and p-type impurity layers 11a and 11b, and is formed on the n-type well 3, and an n-type well contact impurity layer 12 is formed in the n-type well 3. A control gate terminal 13 is connected to all of the p-type impurity layers 11a and 11b and the n-type well contact impurity layer 12. Furthermore, the gate insulating film 4 and the capacitor insulating film 5 are electrically connected together, and form a floating gate 6. The impurity concentration and size, etc., of the elements are also similar to those in the first embodiment.

Unlike the nonvolatile semiconductor memory device 50 in FIG. 1, the nonvolatile semiconductor memory device 50a of this embodiment includes a p-type protective diode impurity layer. Specifically, a protective diode p-type impurity layer 21 is formed astride the border between the p-type well 2 and the n-type well 3 to have the same impurity concentration as each of the p-type impurity layers 11a and 11b and the same depth thereas, e.g., an impurity concentration of approximately $1 \times 10^{20}$ cm$^3$ and a depth of approximately 0.1 μm. The reverse breakdown voltage of a pn junction between the protective diode p-type impurity layer 21 and the n-type well 3 is set higher than the highest voltage applied to the pn junction in an operation of a memory cell, and is set, for example, approximately slightly higher than 10 V.

Operations of the nonvolatile semiconductor memory device 50a configured as above are substantially similar to those of the nonvolatile semiconductor memory device 50 described in the first embodiment.

Specifically, in a write operation, the p-type silicon substrate 1, the source terminal 9, and the drain terminal 10 are all at ground potential, and a high voltage for a write operation, such as 9 V, is applied to the control gate terminal 13.

In this case, since the reverse breakdown voltage of the pn junction formed between the protective diode p-type impurity layer 21 and the n-type well 3 is higher than 10 V as described above, a breakdown due to the write voltage does not occur.

Thus, the provision of the protective diode p-type impurity layer 21 does not affect the write operation.

A read operation and an erase operation are also similar to those in the first embodiment, and in both of the operations, a high voltage is not applied between the n-type well 3 and the p-type silicon substrate 1 or the p-type well 2.

A method for fabricating the nonvolatile semiconductor memory device 50a is also similar to the method for fabricating the nonvolatile semiconductor memory device 50 illustrated in FIGS. 3A-3C and FIG. 4 except that (instead of the protective diode n-type impurity layer 14,) a protective diode p-type impurity layer 21 is formed astride the border between the p-type well 2 and the n-type well 3. An increase in the number of process steps can be avoided by forming the protective diode p-type impurity layer 21 at the same time as the p-type impurity layers 11a and 11b.

Also in a fabrication process for the nonvolatile semiconductor memory device 50a, when contact holes 19 (see FIG. 4) are formed, the n-type well 3 may be positively or negatively charged with respect to the p-type silicon substrate 1 or the p-type well 2.

When the n-type well 3 has been negatively charged, a diode forward voltage less than or equal to about 1 V is applied to the p-type silicon substrate 1 and the p-type well 2, and thus, there is no problem.

In contrast, when the n-type well 3 has been positively charged, the voltage of the n-type well 3 is fixed at the reverse breakdown voltage of the pn junction formed between the protective diode p-type impurity layer 21 and the n-type well 3. The reverse breakdown voltage can be set at a desired value, such as 11 V, by adjusting, e.g., the impurity concentration of the protective diode p-type impurity layer 21.

Specifically, when the n-type well 3 has been positively charged, and has had a higher voltage than the reverse breakdown voltage of the pn junction between the protective diode p-type impurity layer 21 and the p-type well 2, such as 11 V, the breakdown voltage of the pn junction is exceeded, and a high voltage escapes through the protective diode p-type impurity layer 21 to the p-type well 2 (and then to the p-type silicon substrate 1).

As a result, excessive voltage stress is not applied to the gate insulating film 4 and the capacitor insulating film 5. This can reduce degradation in insulating properties of the gate insulating film 4 and the capacitor insulating film 5 and a dielectric breakdown in the gate insulating film 4 and the capacitor insulating film 5.

If no protective diode p-type impurity layer 21 exists, excessive voltage stress is applied to the gate insulating film 4 and the capacitor insulating film 5. The reason for this is that the reverse breakdown voltage between the n-type well 3 and the p-type well 2 is higher than that in this embodiment, for example, higher than or equal to 30 V. The application of excessive voltage stress has caused degradation in insulating properties of the gate insulating film 4 and the capacitor insulating film 5 and a dielectric breakdown in the gate insulating film 4 and the capacitor insulating film 5. The nonvolatile semiconductor memory device 50a of this embodiment can reduce degradation in insulating properties of the gate insulating film 4 and the capacitor insulating film 5 and a dielectric breakdown in the gate insulating film 4 and the capacitor insulating film 5.

In the above-described structure of the nonvolatile semiconductor memory device 50a, the protective diode p-type impurity layer 21 is formed astride the border between the n-type well 3 and the p-type well 2 on which the read transistor 16 is formed. However, the protective diode p-type impurity layer 21 may be formed astride the border between the n-type well 3 and another p-type well except the p-type well 2.

In the above description, the protective diode p-type impurity layer 21 has an impurity concentration and a depth which are respectively identical with the impurity concentration and depth of each of the p-type impurity layers 11a and 11b. This structure is an advantageous structure for reducing an increase in the number of manufacturing process steps, but is not essential. The impurity concentration and depth of the protective diode p-type impurity layer 21 may be adjusted by adding a manufacturing process step such that the breakdown voltage between the protective diode p-type impurity layer 21 and the n-type well 3 is optimum.

Also in this embodiment, similar to the first embodiment, a write method utilizing tunneling current was described. In this write method, for example, a high voltage is applied to the gate insulating film 4, and electrons are injected into the floating gate 6. However, any other electron injection methods, such as hot electron injection, may be used.

In the nonvolatile semiconductor memory device 50a of this embodiment, the read transistor 16 is formed on the p-type well 2. However, the read transistor 16 may be formed on the p-type silicon substrate 1 itself without forming the p-type well 2.

Third Embodiment

Figure 6:
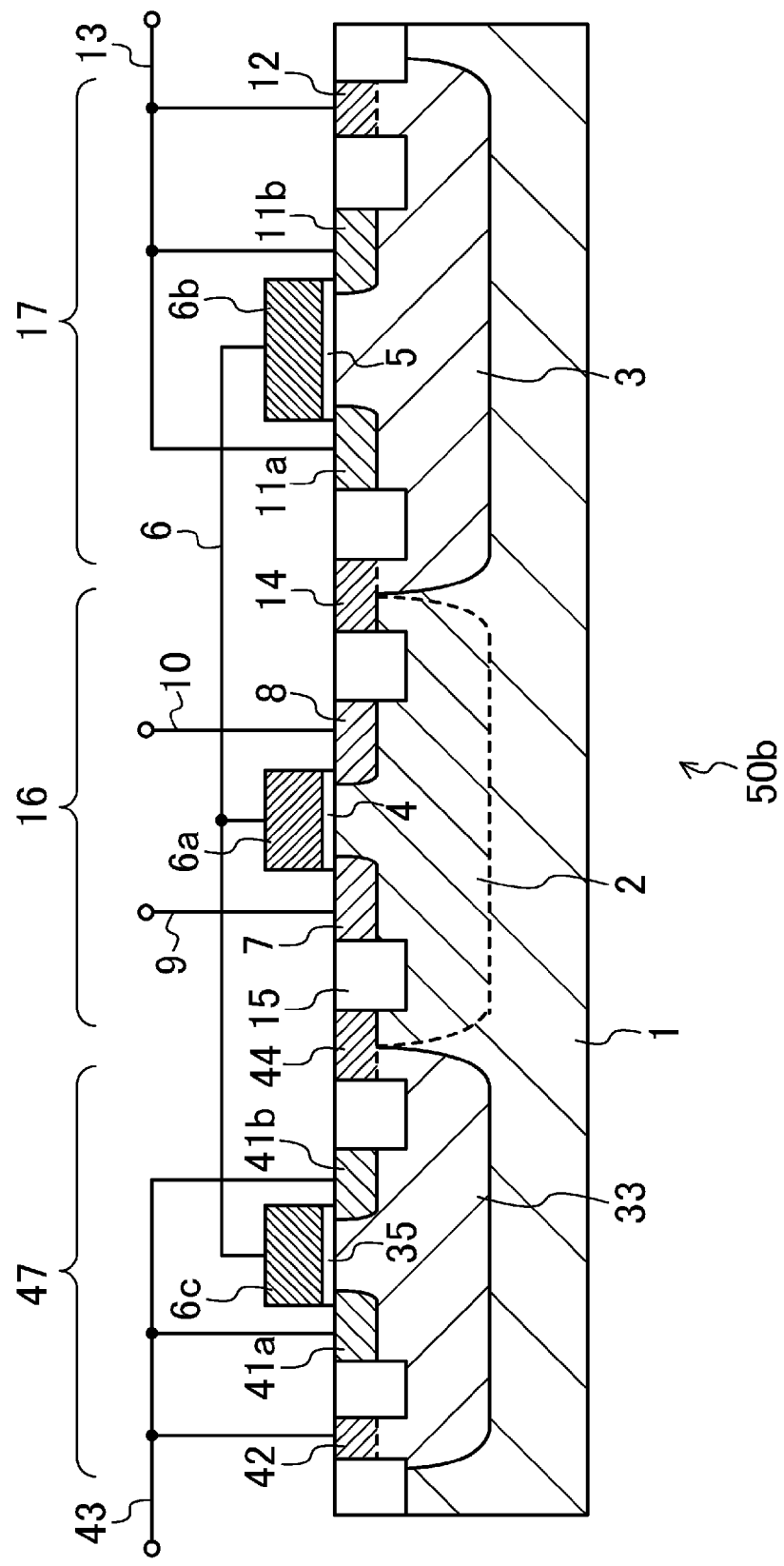
FIG. 6 is a diagram schematically illustrating a cross-sectional structure of an example nonvolatile semiconductor memory device according to a third embodiment.

A nonvolatile semiconductor memory device of a third embodiment and a method for fabricating the same will be described hereinafter with reference to the drawings. FIG. 6 is a diagram schematically illustrating a cross-sectional structure of an example nonvolatile semiconductor memory device 50b according to this embodiment.

A nonvolatile semiconductor memory device 50b in FIG. 6 is formed using a p-type silicon substrate 1. While the nonvolatile semiconductor memory device 50 of the first embodiment includes the read transistor 16 and the write capacitor 17 (see FIG. 1), the nonvolatile semiconductor memory device 50b further includes an erase gate capacitor 47 formed on an n-type well 33, and a protective diode n-type impurity layer 44.

The structures of a read transistor 16 formed on a p-type well 2 and a write capacitor 17 formed on an n-type well 3 are similar to those described in the first embodiment, and the same reference characters as those illustrated in FIG. 1 are used to represent equivalent elements.

The erase gate capacitor 47 is formed on the n-type well 33 formed in the p-type silicon substrate 1. More specifically, the erase gate capacitor 47 is formed on a region of the n-type well 33 defined by an isolation insulating film 15, and serves as a PMIS capacitor including p-type impurity layers 41a and 41b, a capacitor insulating film 35, and a polysilicon capacitor electrode 6c formed on the capacitor insulating film 35.

Furthermore, a heavily doped n-type well contact impurity layer 42 is formed in the n-type well 33 so as to be surrounded by the isolation insulating film 15. The heavily doped p-type impurity layers 41a and 41b and the heavily doped n-type well contact impurity layer 42 which are formed in the n-type well 33 are all connected to an erase gate terminal 43.

Here, the gate insulating film 4, the capacitor insulating film 5, and the capacitor insulating film 35 have the same thickness, e.g., a thickness of 7 nm. A polysilicon gate electrode 6a, a polysilicon capacitor electrode 6b, and the polysilicon capacitor electrode 6c form portions of a continuous polysilicon layer, are, therefore, electrically connected together, and form a floating gate 6.

The area of the capacitor insulating film 5 is sufficiently larger than that of the gate insulating film 4, and is set to, e.g., approximately three times the area of the gate insulating film 4. Furthermore, the area of the capacitor insulating film 35 is sufficiently smaller than the total area of the gate insulating film 4 and the capacitor insulating film 5, and is set to, e.g., approximately one tenth the total area.

Similar to the nonvolatile semiconductor memory device 50 in FIG. 1, a protective diode n-type impurity layer 14 is formed astride the border between the p-type well 2 and the n-type well 3, and has the same impurity concentration as each of the n-type source impurity layer 7 and the n-type drain impurity layer 8 (an impurity concentration of, e.g., approximately $1 \times 10^{17}$ cm$^3$) and the same depth thereas. The reverse breakdown voltage of a pn junction formed between the protective diode n-type impurity layer 14 and the p-type well 2 is set higher than the highest voltage applied to the pn junction in an operation of a memory cell, and is set, for example, approximately slightly higher than 10 V.

Furthermore, a protective diode n-type impurity layer 44 is formed astride the border between the p-type well 2 on which the read transistor 16 is formed and the n-type well 33 on which the erase gate capacitor 47 is formed, and has the same impurity concentration as each of the n-type source impurity layer 7 and the n-type drain impurity layer 8 and the same depth thereas.

The reverse breakdown voltage of a pn junction formed between the protective diode n-type impurity layer 44 and the p-type well 2 is also set to a voltage higher than the highest voltage applied to the pn junction in an operation of the memory cell, and is set, for example, approximately slightly higher than 10 V.

A write operation and a read operation of the nonvolatile semiconductor memory device 50b having the above structure are similar to those of the nonvolatile semiconductor memory device 50 described in the first embodiment. In the write operation and the read operation, the erase gate terminal 43 of the erase gate capacitor 47 is at ground potential.

In the write operation, since the reverse breakdown voltage of the pn junction between the protective diode n-type impurity layer 14 and the p-type well 2 is higher than 10 V as described above, a breakdown due to a write voltage does not occur. Thus, the provision of the protective diode n-type impurity layer 14 does not affect the write operation.

In the read operation, a high voltage is not applied between the n-type well 3 and the p-type silicon substrate 1 or the p-type well 2.

Figure 7:
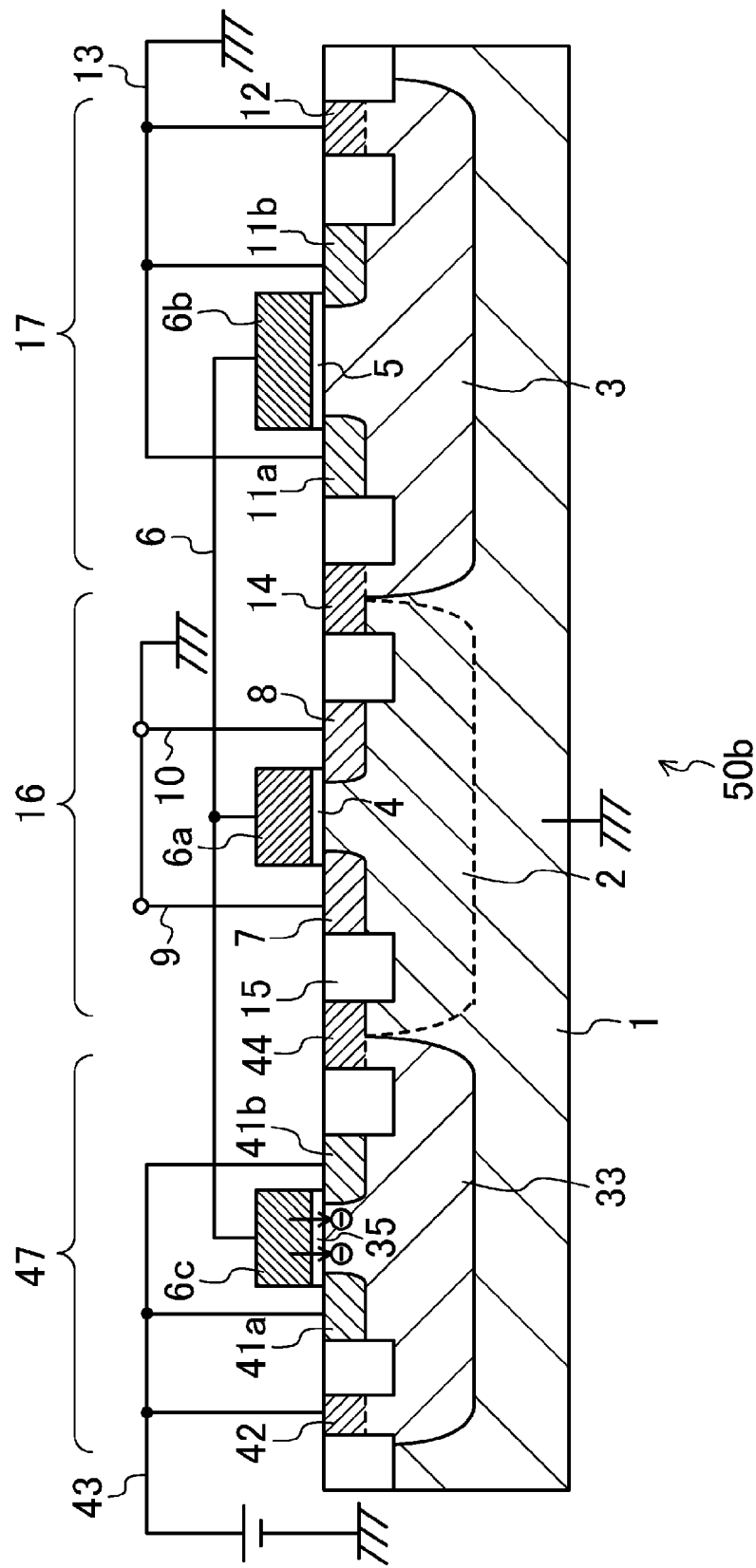
FIG. 7 is a schematic view illustrating an erase operation of the example nonvolatile semiconductor memory device according to the third embodiment.

Next, an erase operation of the nonvolatile semiconductor memory device 50b will be described with reference to FIG. 7. In the erase operation, as illustrated in FIG. 7, the p-type silicon substrate 1, the source terminal 9, the drain terminal 10, and the control gate terminal 13 are all at ground potential, and a high voltage, such as 9 V, is applied to the erase gate terminal 43. In this case, since the reverse breakdown voltage of the pn junction formed between the protective diode n-type impurity layer 44 and the p-type well 2 is higher than 10 V as described above, a breakdown is not caused.

The capacitor insulating film 35 is designed such that the area of the capacitor insulating film 35 is smaller than the total area of the gate insulating film 4 and the capacitor insulating film 5, e.g., approximately one tenth of the total area. Thus, the high voltage applied to the erase gate terminal 43 is divided by the capacity ratio among the gate insulating film 4, the capacitor insulating film 5, and the capacitor insulating film 35, and a high voltage of approximately 8 V is applied to the capacitor insulating film 35. As a result, an inversion layer is formed in the surface of the n-type well 33, and electrons are removed from the polysilicon capacitor electrode 6c, i.e., the floating gate 6, thereby performing an erase operation.

Figure 10A:
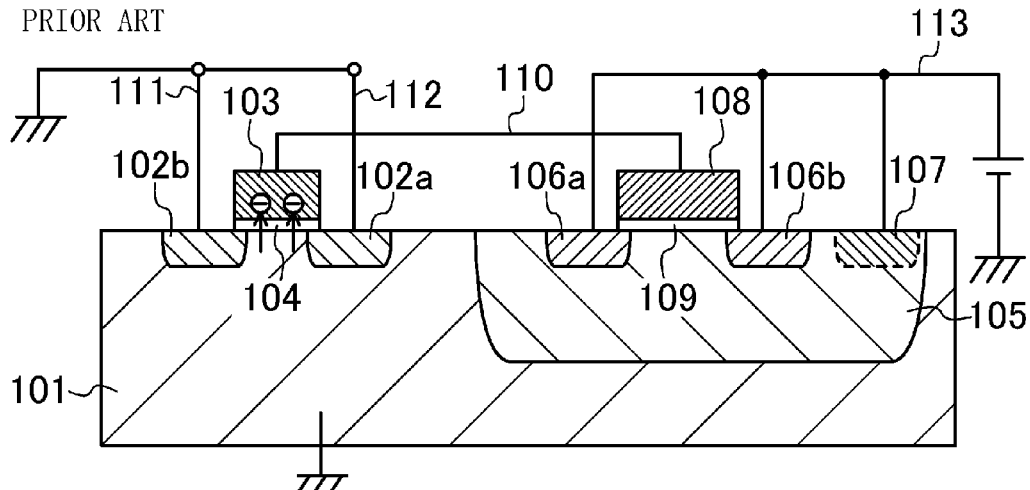
FIGS. 10A-10C are schematic views illustrating operations of the conventional nonvolatile semiconductor memory device, and sequentially illustrate a write operation, a read operation, and an erase operation.
Figure 10B:
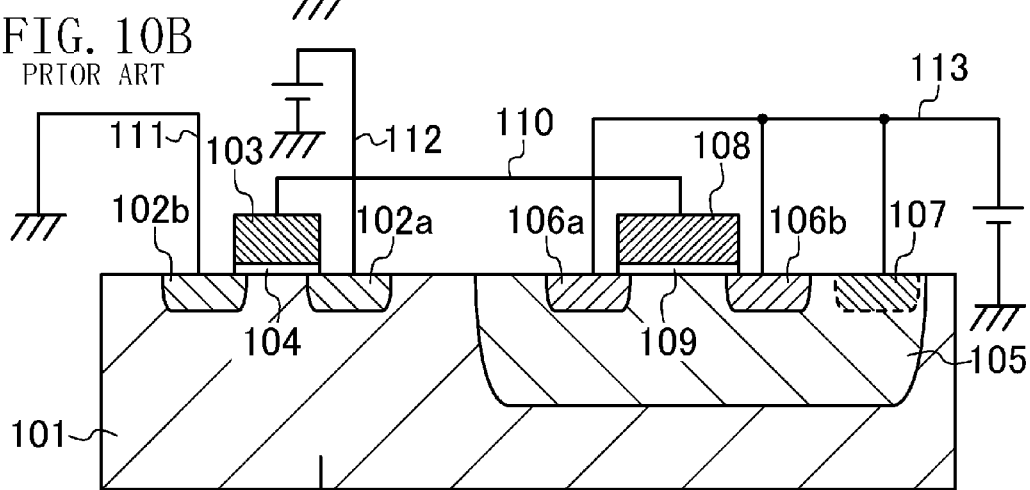
Figure 10C:
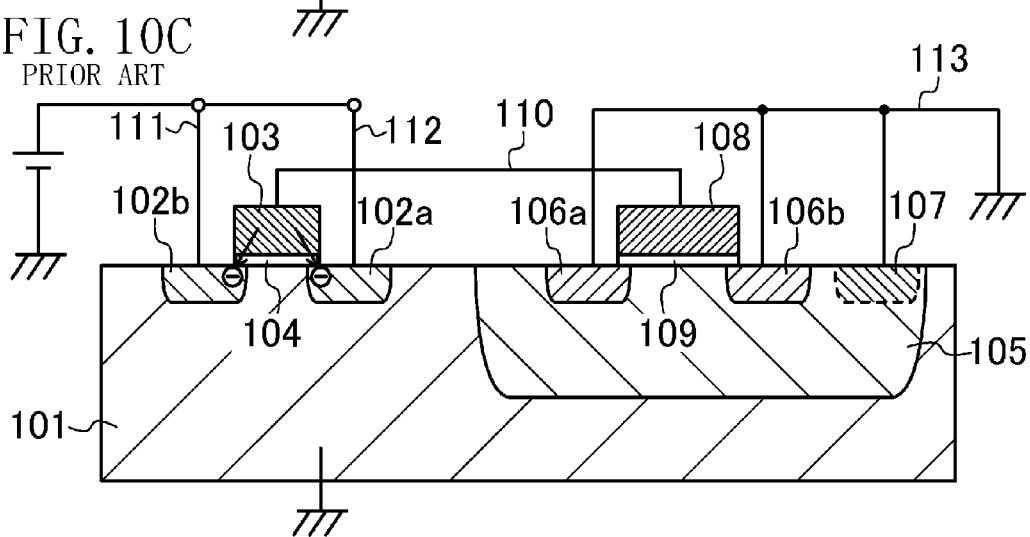

Here, such electron tunneling through gate end portions as illustrated in FIG. 10C may cause characteristic degradation of a MISFET. However, since the nonvolatile semiconductor memory device 50b in FIG. 6 includes the erase gate capacitor 47, electron tunneling in the erase operation occurs only through a capacitor, thereby avoiding characteristic degradation of a MISFET. In the write operation, electrons are tunneled through the entire gate insulating film of the MISFET, thereby reducing characteristic degradation to a minimum.

As such, the nonvolatile semiconductor memory device 50b of this embodiment operates.

The nonvolatile semiconductor memory device 50b can be fabricated through process steps similar to those of the nonvolatile semiconductor memory device 50 of the first embodiment described with reference to FIGS. 3A-3C and FIG. 4. Specifically, in process steps for forming elements of the write capacitor 17 (the n-type well 3, the capacitor insulating film 5, the polysilicon capacitor electrode 6b, the p-type impurity layers 11a and 11b, etc.), elements of the erase gate capacitor 47 (the n-type well 33, the capacitor insulating film 35, the polysilicon capacitor electrode 6c, the p-type impurity layers 41a and 41b, etc.) are also additionally formed. Furthermore, the protective diode n-type impurity layer 44 is formed together with the protective diode n-type impurity layer 14. In such a way, an increase in the number of process steps can be avoided. The sizes, etc., of all of the elements of the erase gate capacitor 47 and the protective diode n-type impurity layer 44 are adjusted as needed.

In such a fabrication process, when contact holes 19 (see FIG. 4) are formed, the n-type well 3 or the n-type well 33 may be positively or negatively charged with respect to the p-type silicon substrate 1 or the p-type well 2. However, excessive voltage stress is not applied to the gate insulating film 4, the capacitor insulating film 5, and the capacitor insulating film 35.

When the n-type well 3 is charged, this results in such a situation as described in the first embodiment. Also when the n-type well 33 is charged, the provision of the protective diode n-type impurity layer 44 provides similar advantages.

Specifically, when the n-type well 33 has been negatively charged, a diode forward voltage less than or equal to about 1 V is applied to the p-type silicon substrate 1 and the p-type well 2, and thus, there is no problem.

When the n-type well 33 has been positively charged, the voltage of the n-type well 33 is fixed at the reverse breakdown voltage of the pn junction formed between the protective diode n-type impurity layer 44 and the p-type well 2. The reverse breakdown voltage can be set at a desired value, such as 11 V, by adjusting, e.g., the impurity concentration of the protective diode n-type impurity layer 44.

When the n-type well 33 has been positively charged as described above, and has had a higher voltage than the reverse breakdown voltage of the pn junction between the protective diode n-type impurity layer 44 and the p-type well 2, such as 11 V, the breakdown voltage of the pn junction is exceeded, and the high voltage escapes through the protective diode n-type impurity layer 44 to the p-type well 2 (and then to the p-type silicon substrate 1).

As above, the nonvolatile semiconductor memory device 50b including the erase gate capacitor 47 can also reduce degradation in insulating properties of a gate insulating film or a dielectric breakdown in the gate insulating film caused by applying a high voltage to the gate insulating film during a fabrication process.

In the above description, for example, the protective diode n-type impurity layer 44 is formed astride the border between the n-type well 33 and the p-type well 2 on which the read transistor 16 is formed. However, the protective diode n-type impurity layer 44 may be formed astride the border between the n-type well 33 and another p-type well except the p-type well 2. Also in this case, a high voltage can escape through the protective diode n-type impurity layer 44 to another p-type well and then to the p-type silicon substrate 1.

In the above description, the protective diode n-type impurity layer 44 has an impurity concentration and a depth which are respectively identical with the impurity concentration and depth of each of the n-type source impurity layer 7 and the n-type drain impurity layer 8. This structure is an advantageous structure for reducing an increase in the number of manufacturing process steps, but is not essential. The impurity concentration and depth of the protective diode n-type impurity layer 44 may be adjusted by adding a manufacturing process step such that the breakdown voltage between the protective diode n-type impurity layer 44 and the p-type well is optimum.

In the above description, the nonvolatile semiconductor memory device 50b includes the p-type impurity layers 41a and 41b, and in the erase operation, the inversion layer is formed in the surface of the n-type well 33. However, the nonvolatile semiconductor memory device 50b does not need to include the p-type impurity layers 41a and 41b, and in the erase operation, the inversion layer does not need to be formed in the surface of the n-type well 33.

A write method utilizing tunneling current was described. In this write method, a high voltage is applied to the gate insulating film 4, and electrons are injected into the floating gate 6. However, any other electron injection methods, such as hot electron injection, may be used.

Figure 12:
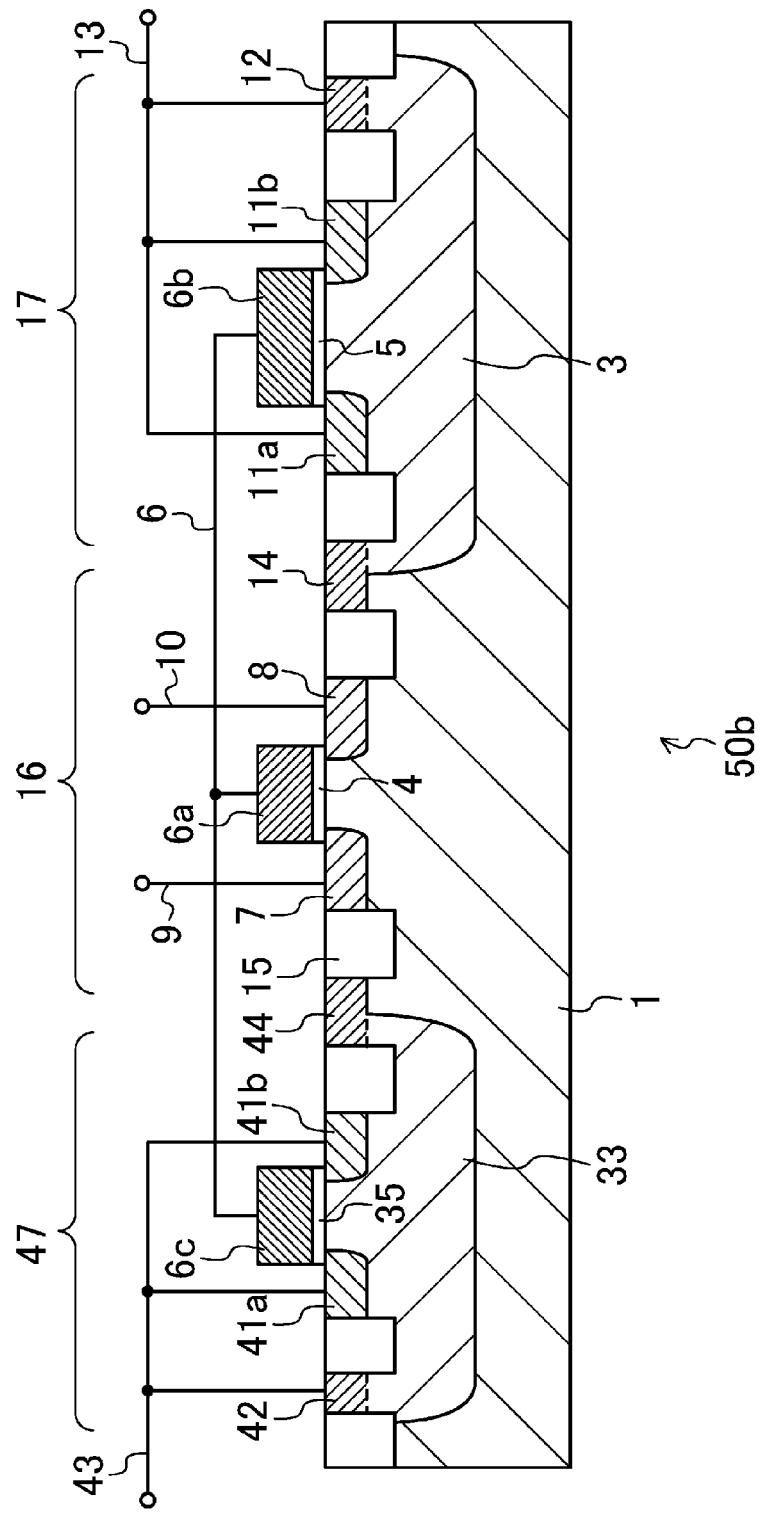
FIG. 12 is a cross-sectional diagram illustrating a variation of the nonvolatile semiconductor memory device illustrated in FIG. 6.

An example was described in which the read transistor 16 is formed on the p-type well 2. However, as shown in FIG. 12, the read transistor 16 may be formed on the p-type silicon substrate 1 itself without forming the p-type well 2.

Fourth Embodiment

Figure 8:
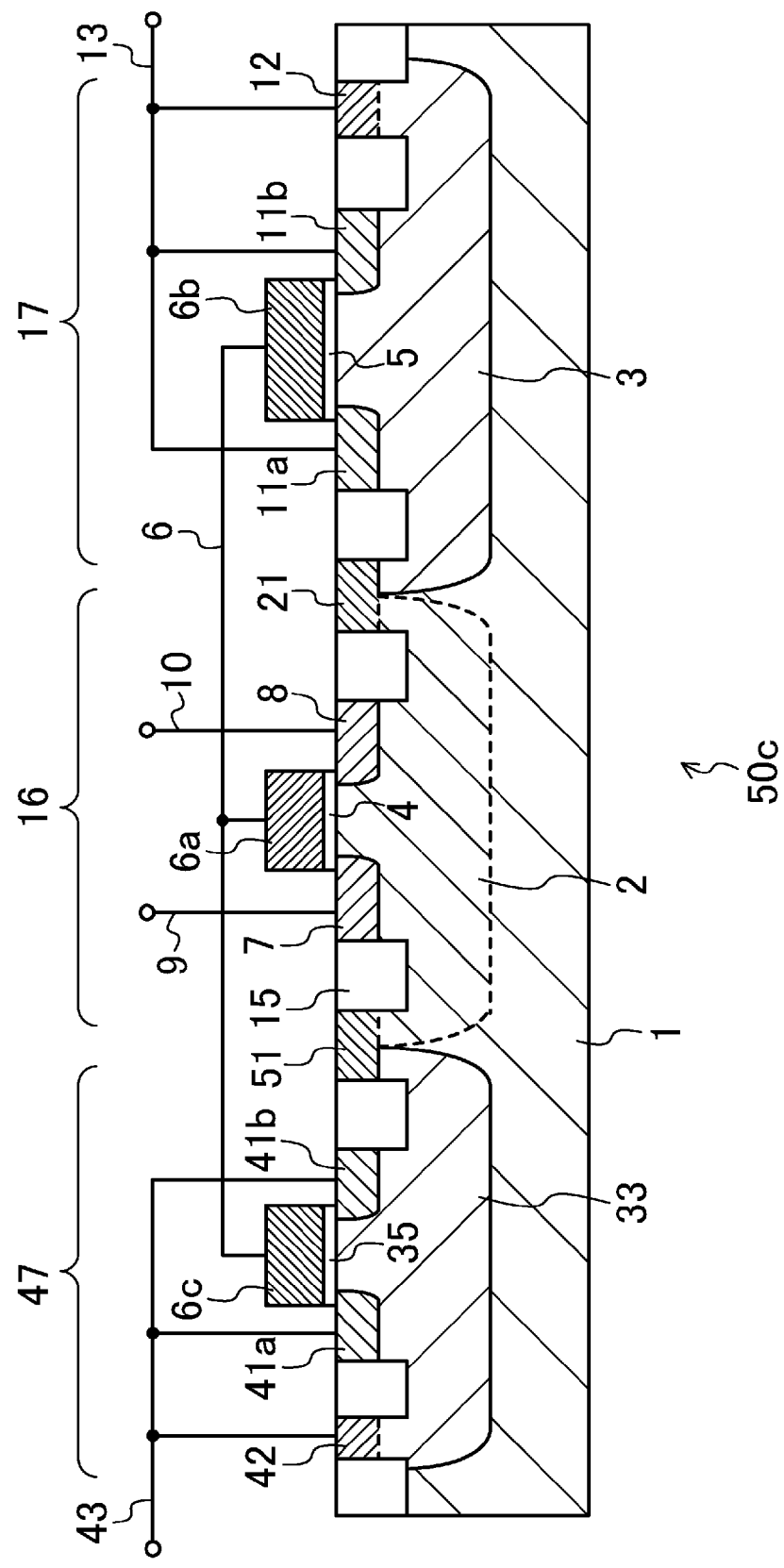
FIG. 8 is a diagram schematically illustrating a cross-sectional structure of an example nonvolatile semiconductor memory device according to a fourth embodiment.
Figure 9:
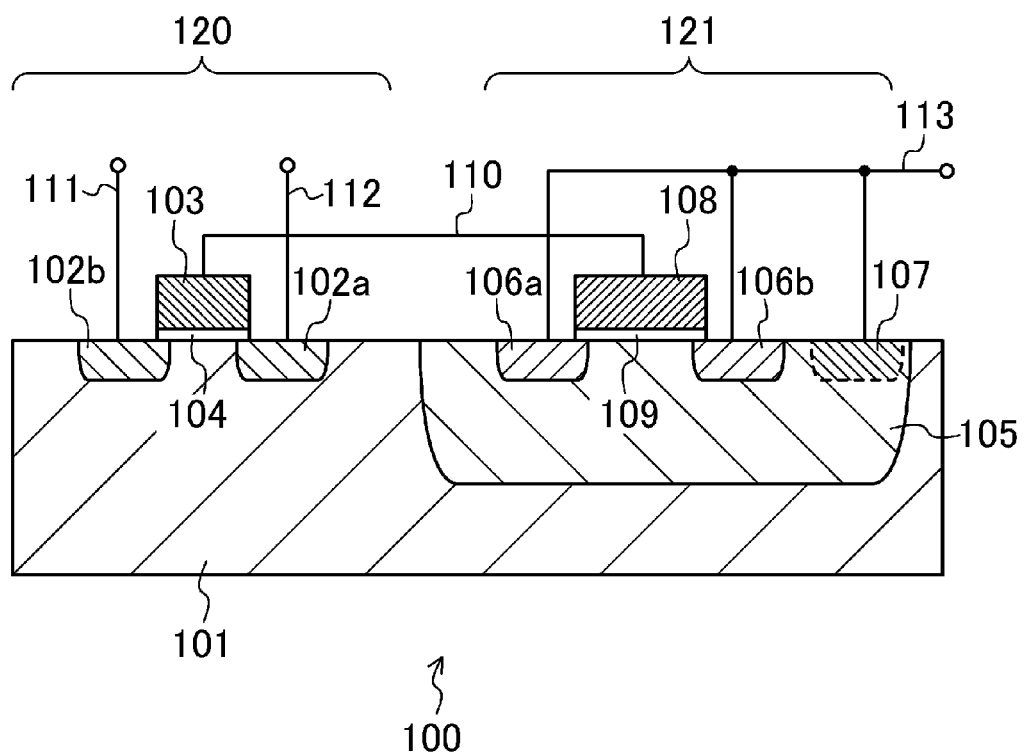
FIG. 9 is a diagram schematically illustrating a cross-sectional structure of a conventional nonvolatile semiconductor memory device.

A nonvolatile semiconductor memory device of a fourth embodiment and a method for fabricating the same will be described hereinafter with reference to the drawings. FIG. 8 is a diagram schematically illustrating a cross-sectional structure of an example nonvolatile semiconductor memory device 50c according to this embodiment.

The nonvolatile semiconductor memory device 50c in FIG. 8 is formed using a p-type silicon substrate 1. While the nonvolatile semiconductor memory device 50a of the second embodiment includes the read transistor 16 and the write capacitor 17 (see FIG. 5), the nonvolatile semiconductor memory device 50c further includes an erase gate capacitor 47, and a protective diode p-type impurity layer 51. Furthermore, in other words, a protective diode p-type impurity layer 21 and a protective diode p-type impurity layer 51 are provided instead of the n-type protective diode impurity layers (the protective diode n-type impurity layer 14 and the protective diode n-type impurity layer 44) of the nonvolatile semiconductor memory device 50b of the third embodiment (see FIG. 6). Thus, in FIG. 8, the same reference characters as those illustrated in FIGS. 5 and 6 are used to represent equivalent elements.

The protective diode p-type impurity layer 21 has an impurity concentration and a depth which are respectively identical with the impurity concentration and depth of each of the p-type impurity layers 11a and 11b. The protective diode p-type impurity layer 51 has an impurity concentration and a depth which are respectively identical with the impurity concentration and depth of each of the p-type impurity layers 41a and 41b.

The reverse breakdown voltage of a pn junction formed between the protective diode p-type impurity layer 21 and the n-type well 3 is set higher than the highest voltage applied to the pn junction in an operation of a memory cell, and is set, for example, approximately slightly higher than 10 V. Furthermore, the reverse breakdown voltage of a pn junction formed between the protective diode p-type impurity layer 51 and the n-type well 33 is also set higher than the highest voltage applied to the pn junction in an operation of the memory cell, and is set, for example, approximately slightly higher than 10 V as has been anticipated.

A write operation and a read operation of such a nonvolatile semiconductor memory device 50c are similar to those described in the second embodiment. Since, in the write operation, the reverse breakdown voltage of the pn junction formed between the protective diode p-type impurity layer 21 and the n-type well 3 is higher than 10 V as described above, a breakdown due to the write voltage does not occur. Thus, the provision of the protective diode p-type impurity layer 21 does not affect the write operation. Furthermore, in the read operation, a high voltage is not applied between the n-type well 3 and the p-type silicon substrate 1 or the p-type well 2.

An erase operation of the nonvolatile semiconductor memory device 50c is similar to that of the nonvolatile semiconductor memory device 50b described in the third embodiment. However, a pn junction is formed between the protective diode p-type impurity layer 51 and the n-type well 33, and the reverse breakdown voltage of the pn junction is higher than 10 V as described above, thereby preventing a breakdown.

A method for fabricating the nonvolatile semiconductor memory device 50c of this embodiment is also similar to the fabrication method described in the second embodiment or the third embodiment. For example, in the fabrication method of the second embodiment, elements of the erase gate capacitor 47 are also additionally formed in process steps for forming elements of the write capacitor 17. Furthermore, the protective diode p-type impurity layer 51 is formed together with the protective diode p-type impurity layer 21. The sizes, etc., of all of the elements of the erase gate capacitor 47 and the protective diode p-type impurity layer 51 are adjusted as needed.

Also in such a fabrication process, when contact holes 19 (see FIG. 4) are formed, the n-type well 3 or the n-type well 33 may be positively or negatively charged with respect to the p-type silicon substrate 1 or the p-type well 2 as in the other embodiments. However, a high voltage can escape through the protective diode p-type impurity layer 21 or the protective diode p-type impurity layer 51 to the p-type well 2 (and then to the p-type silicon substrate 1). Thus, excessive voltage stress is not applied to the gate insulating film 4, the capacitor insulating film 5, and the capacitor insulating film 35.

In the above description, for example, the protective diode p-type impurity layer 51 is formed astride the border between the n-type well 33 and the p-type well 2 on which the read transistor 16 is formed. However, the protective diode p-type impurity layer 51 may be formed astride the border between the n-type well 33 and another p-type well except the p-type well 2.

In the above description, the protective diode p-type impurity layer 51 has an impurity concentration and a depth which are respectively identical with the impurity concentration and depth of each of the n-type source impurity layer 7 and the n-type drain impurity layer 8. This structure is an advantageous structure for reducing an increase in the number of manufacturing process steps, but is not essential. The impurity concentration and depth of the protective diode p-type impurity layer 51 may be adjusted by adding a manufacturing process step such that the breakdown voltage between the protective diode p-type impurity layer 51 and the p-type well is optimum.

In the above description, the nonvolatile semiconductor memory device 50c includes the p-type impurity layers 41a and 41b, and in the erase operation, the inversion layer is formed in the surface of the n-type well 33. However, the nonvolatile semiconductor memory device 50c does not need to include the p-type impurity layers 41a and 41b, and in the erase operation, the inversion layer does not need to be formed in the surface of the n-type well 33.

A write method utilizing tunneling current was described. In this write method, a high voltage is applied to the gate insulating film 4, and electrons are injected into the floating gate 6. However, any other electron injection methods, such as hot electron injection, may be used.

An example was described in which the read transistor 16 is formed on the p-type well 2. However, the read transistor 16 may be formed on the p-type silicon substrate 1 itself without forming the p-type well 2.

In the above description of the first through fourth embodiments, for example, a semiconductor substrate, a read transistor, a region of the semiconductor substrate on which the read transistor is formed, a well region on which a write capacitor is formed, and a well region on which an erase capacitor is formed are p-type, an NMISFET, p-type, n-type, and n-type, respectively. However, the conductivity types of these elements are not limited to the above types, and may be opposite in polarity to the above types. Specifically, even when the semiconductor substrate, the read transistor, the region of the semiconductor substrate on which the read transistor is formed, the well region on which the write capacitor is formed, and the well region on which the erase capacitor is formed are n-type, a PMISFET, n-type, p-type, and p-type, respectively, the nonvolatile semiconductor memory device described in each embodiment is provided.

The nonvolatile semiconductor memory device described above can be mounted, at low cost, on an LSI circuit fabricated through a standard CMIS process, can reduce degradation or breakdown in a gate insulating film due to the influence of charging, etc., during a fabrication process, and thus, is useful also for the purposes of, e.g., circuit trimming and information implementation for, e.g., secure data.

What is claimed is:

1. A nonvolatile semiconductor memory device, comprising:
    a memory cell including a MISFET which is formed on a semiconductor substrate of a first conductivity type, and forms a channel of a second conductivity type, and a MIS capacitor formed on a first well of the second conductivity type in the semiconductor substrate, wherein
    the MISFET includes a gate electrode formed on the semiconductor substrate with a gate insulating film interposed between the gate electrode and the semiconductor substrate, and source/drain impurity layers formed in portions of the semiconductor substrate located at both sides of the gate electrode,
    the MIS capacitor includes a second electrode formed on the first well functioning as a first electrode with a capacitor insulating film interposed between the second electrode and the first well, and a first impurity layer of a first conductivity type formed in the first well,
    the gate electrode and the second electrode are electrically connected together, and form a floating gate,
    the gate insulating film and the capacitor insulating film are made of a same material, and have a same thickness,
    the gate electrode and the second electrode are made of a same conductive film,
    a second impurity layer is formed on a pn junction between the semiconductor substrate and the first well, and
    the second impurity layer is in direct contact with both of the semiconductor substrate and the first well.

2. The nonvolatile semiconductor memory device of claim 1, wherein
    the second impurity layer has the first conductivity type, and
    a reverse breakdown voltage of a junction between the second impurity layer and the first well is lower than a reverse breakdown voltage of a junction between the semiconductor substrate and the first well and higher than a voltage applied to the first well in an operation of the memory cell.

3. The nonvolatile semiconductor memory device of claim 1, wherein
    the second impurity layer has the second conductivity type, and
    a reverse breakdown voltage of a junction between the second impurity layer and the semiconductor substrate is lower than a reverse breakdown voltage of a junction between the semiconductor substrate and the first well and higher than a voltage applied to the first well in an operation of the memory cell.

4. The nonvolatile semiconductor memory device of claim 1, wherein
    the semiconductor substrate is p-type,
    the MISFET is an n-type MISFET, and
    the MIS capacitor is a p-type MIS capacitor.

5. The nonvolatile semiconductor memory device of claim 1, wherein an area occupied by the gate insulating film is smaller than an area occupied by the capacitor insulating film.

6. The nonvolatile semiconductor memory device of claim 1, wherein the MIS capacitor is a write capacitor.

7. The nonvolatile semiconductor memory device of claim 2, wherein the second impurity layer has an impurity concentration and a depth which are identical with an impurity concentration and depth of the first impurity layer, respectively.

8. The nonvolatile semiconductor memory device of claim 3, wherein the second impurity layer has an impurity concentration and a depth which are identical with an impurity concentration and depth of the first impurity layer, respectively.

9. A nonvolatile semiconductor memory device, comprising:
    a memory cell including a MISFET which is formed on a semiconductor substrate of a first conductivity pe, and forms a channel of a second conductivity type, and a MIS capacitor formed on a first well of the second conductivity type in the semiconductor substrate, wherein
    the MISFET includes a gate electrode formed on the semiconductor substrate with a gate insulating film interposed between the gate electrode and the semiconductor substrate, and source/drain impurity layers formed in portions of the semiconductor substrate located at both sides of the gate electrode,
    the MIS capacitor includes a second electrode formed on the first well functioning as a first electrode with a capacitor insulating film interposed between the second electrode and the first well, and a first impurity layer of a first conductivity type formed in the first well, the gate electrode and the second electrode are electrically connected together, and form a floating gate, the gate insulating film and the capacitor insulating film are made of a same material, and have a same thickness, the gate electrode and the second electrode are made of a same conductive film, the MISFET is formed on a second well of the first conductivity type formed in the semiconductor substrate, and a second impurity layer is formed on a pn junction between the second well and the first well, and the second impurity layer is in direct contact with both of the second well and the first well.

10. A nonvolatile semiconductor memory device, comprising:

a memory cell including a MISFET which is formed on a semiconductor substrate of a first conductivity type, and forms a channel of a second conductivity type, a first MIS capacitor formed on a first well of the second conductivity type in the semiconductor substrate, and a second MIS capacitor formed on a second well of the second conductivity type in the semiconductor substrate, wherein the MISFET includes a gate electrode formed on the semiconductor substrate with a gate insulating film interposed between the gate electrode and the semiconductor substrate, and source/drain impurity layers formed in portions of the semiconductor substrate located at both sides of the gate electrode, the first MIS capacitor includes a second electrode formed on the first well functioning as a first electrode with a first capacitor insulating film interposed between the second electrode and the first well, and a first impurity layer of the first conductivity type formed in the first well, the second MIS capacitor includes a fourth electrode formed on the second well functioning as a third electrode with a second capacitor insulating film interposed between the fourth electrode and the second well, the gate electrode, the second electrode, and the fourth electrode are electrically connected together, and form a floating gate, the gate insulating film, the first capacitor insulating film, and the second capacitor insulating film are made of a same material, and have a same thickness, the gate electrode, the second electrode, and the fourth electrode are made of a same conductive film, a second impurity layer is formed on a first pn junction between the semiconductor substrate and the first well, the second impurity layer is in direct contact with both of the semiconductor substrate and the first well, a third impurity layer is formed on a second pn junction between the semiconductor substrate and the second well, and the third impurity layer is in direct contact with both of the semiconductor substrate and the second well.

11. The nonvolatile semiconductor memory device of claim 10, wherein the second MIS capacitor further includes a fourth impurity layer of the first conductivity type formed in the second well.

12. The nonvolatile semiconductor memory device of claim 10, wherein the second impurity layer has the first conductivity type, and a reverse breakdown voltage of a junction between the second impurity layer and the first well is lower than a reverse breakdown voltage of a junction between the semiconductor substrate and the first well and higher than a voltage applied to the first well in an operation of the memory cell.

13. The nonvolatile semiconductor memory device of claim 10, wherein the second impurity layer has the second conductivity type, and a reverse breakdown voltage of a junction between the second impurity layer and the semiconductor substrate is lower than a reverse breakdown voltage of a junction between the semiconductor substrate and the first well and higher than a voltage applied to the first well in an operation of the memory cell.

14. The nonvolatile semiconductor memory device of claim 10, wherein the third impurity layer has the first conductivity type, and a reverse breakdown voltage of a junction between the third impurity layer and the second well is lower than a reverse breakdown voltage of a junction between the semiconductor substrate and the second well and higher than a voltage applied to the second well in an operation of the memory cell.

15. The nonvolatile semiconductor memory device of claim 10, wherein the third impurity layer has the second conductivity type, and a reverse breakdown voltage of a junction between the third impurity layer and the semiconductor substrate is lower than a reverse breakdown voltage of a junction between the semiconductor substrate and the second well and higher than a voltage applied to the second well in an operation of the memory cell.

16. The nonvolatile semiconductor memory device of claim 10, wherein the semiconductor substrate is p-type, the MISFET is an n-type MISFET, and both of the first MIS capacitor and the second MIS capacitor are p-type MIS capacitors.

17. The nonvolatile semiconductor memory device of claim 10, wherein an area occupied by the gate insulating film is smaller than an area occupied by the first capacitor insulating film and larger than an area occupied by the second capacitor insulating film.

18. The nonvolatile semiconductor memory device of claim 10, wherein the first MIS capacitor is a write capacitor, and the second MIS capacitor is an erase capacitor.

19. The nonvolatile semiconductor memory device of claim 12, wherein the second impurity layer has an impurity concentration and a depth which are identical with an impurity concentration and depth of the first impurity layer, respectively.

20. The nonvolatile semiconductor memory device of claim 13, wherein the second impurity layer has an impurity concentration and a depth which are identical with an impurity concentration and depth of each of the source/drain impurity layers, respectively.

21. The nonvolatile semiconductor memory device of claim 14, wherein the third impurity layer has an impurity concentration and a depth which are identical with an impurity concentration and depth of the second impurity layer, respectively.

22. The nonvolatile semiconductor memory device of claim 15, wherein the third impurity layer has an impurity concentration and a depth which are identical with an impurity concentration and depth of each of the source/drain impurity layers, respectively.

23. A nonvolatile semiconductor memory device, comprising:
- a memory cell including a MISFET which is formed on a semiconductor substrate of a first conductivity type, and forms a channel of a second conductivity type, a first MIS capacitor formed on a first well of the second conductivity type in the semiconductor substrate, and a second MIS capacitor formed on a second well of the second conductivity type in the semiconductor substrate, wherein
- the MISFET includes a gate electrode formed on the semiconductor substrate with a gate insulating film interposed between the gate electrode and the semiconductor substrate, and source/drain impurity layers formed in portions of the semiconductor substrate located at both sides of the gate electrode,
- the first MIS capacitor includes a second electrode formed on the first well functioning as a first electrode with a first capacitor insulating film interposed between the second electrode and the first well, and a first impurity layer of the first conductivity type formed in the first well,
- the second MIS capacitor includes a fourth electrode formed on the second well functioning as a third electrode with a second capacitor insulating film interposed between the fourth electrode and the second well,
- the gate electrode, the second electrode, and the fourth electrode are electrically connected together, and form a floating gate,
- the gate insulating film, the first capacitor insulating film, and the second capacitor insulating film are made of a same material, and have a same thickness,
- the gate electrode, the second electrode, and the fourth electrode are made of a same conductive film,
- the MISFET is formed on a third well of the first conductivity type formed in the semiconductor substrate,
- a second impurity layer is formed on a pn junction between the third well and the first well, and the second impurity layer is in direct contact with both of the third well and the first well, and
- a third impurity layer is formed on a pn junction between the third well and the second well, and the third impurity layer is in direct contact with both of the third well and the second well.

* * * * *